(12) United States Patent
Won et al.

(10) Patent No.: US 9,595,549 B2
(45) Date of Patent: Mar. 14, 2017

(54) DISPLAY DEVICE COMPRISING A PLURALITY OF MICROCAVITIES AND AN ENCAPSULATION LAYER THAT SEALS THE PLURALITY OF MICROCAVITIES AND METHOD OF MANUFACTURING THE SAME

(71) Applicant: Samsung Display Co., Ltd., Yongin, Gyeonggi-do (KR)

(72) Inventors: Sung Hwan Won, Yongin (KR); Seon Uk Lee, Yongin (KR); Pil Sook Kwon, Yongin (KR); Yong Seok Kim, Yongin (KR); Won Tae Kim, Yongin (KR); Han Joon Yoo, Yongin (KR); Woo Jae Lee, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 198 days.

(21) Appl. No.: 14/151,029

(22) Filed: Jan. 9, 2014

(65) Prior Publication Data

US 2015/0036087 A1 Feb. 5, 2015

(30) Foreign Application Priority Data

Aug. 1, 2013 (KR) .................. 10-2013-0091575

(51) Int. Cl.
*G02F 1/1333* (2006.01)
*G02F 1/1335* (2006.01)
*H01L 27/12* (2006.01)
*G02F 1/1362* (2006.01)

(52) U.S. Cl.
CPC ........ *H01L 27/1296* (2013.01); *G02F 1/1362* (2013.01); *G02F 1/133377* (2013.01); *G02F 1/133512* (2013.01); *G02F 1/133514* (2013.01)

(58) Field of Classification Search
CPC ......... G02F 1/133345; G02F 1/133377; G02F 1/1362

See application file for complete search history.

(56) References Cited

U.S. PATENT DOCUMENTS

2012/0062448 A1* 3/2012 Kim .................. G02F 1/133377
345/55

FOREIGN PATENT DOCUMENTS

| KR | 10-2014-0048731 | 4/2014 |
| KR | 10-2014-0145723 | 12/2014 |

* cited by examiner

*Primary Examiner* — Paul Lee
(74) *Attorney, Agent, or Firm* — Knobbe Martens Olson & Bear LLP

(57) ABSTRACT

A display device and a method of manufacturing the display device improve reliability by preventing contact between a color filter, a light blocking member and a liquid crystal layer. The display device includes: a substrate including pixel areas; a thin film transistor formed on the substrate; a pixel electrode connected to the thin film transistor and formed in the pixel areas; a roof layer formed on the pixel electrode; microcavities interposed between the pixel electrode and the roof layer; an injection hole formed in the roof layer, the injection hole configured to expose at least a portion of the microcavities; a liquid crystal layer filled in at least one of the microcavities; an encapsulation layer formed on the roof layer, the encapsulation layer configured to cover the injection hole and to seal the microcavities; and an organic layer formed on the encapsulation layer.

20 Claims, 22 Drawing Sheets

DISPLAY DEVICE COMPRISING A PLURALITY OF MICROCAVITIES AND AN ENCAPSULATION LAYER THAT SEALS THE PLURALITY OF MICROCAVITIES AND METHOD OF MANUFACTURING THE SAME

CROSS-REFERENCE TO RELATED APPLICATIONS

This application claims priority to, and the benefit of, Korean Patent Application No. 10-2013-0091575 filed in the Korean Intellectual Property Office on Aug. 1, 2013, the entire contents of which are incorporated herein by reference.

BACKGROUND

Field

The present disclosure relates to a display device and a method of manufacturing a display device capable of improving reliability by preventing contact between a color filter, a light blocking member and the like, and a liquid crystal layer.

Description of the Related Technology

A liquid crystal display, which is one of the more common types of flat panel displays currently in use, typically includes two sheets of display panels with field generating electrodes, such as a pixel electrode and a common electrode, formed thereon, and a liquid crystal layer interposed therebetween. The liquid crystal display generates electric fields in the liquid crystal layer by applying voltage to the field generating electrodes, and determines the direction of liquid crystal molecules of the liquid crystal layer by the generated electric field, thus controlling polarization of incident light so as to display images.

The two sheets of display panels, which configure the liquid crystal display, may include a thin film transistor array panel, and an opposing display panel. On the thin film transistor array panel, a gate line configured to transmit a gate signal and a data line configured to transmit a data signal are formed to intersect each other, and a thin film transistor connected to the gate line and the data line, a pixel electrode connected to the thin film transistor, and the like may be formed. On the opposing display panel, a light blocking member, a color filter, a common electrode, and the like may be formed. In some cases, the light blocking member, the color filter, and the common electrode may be formed on the thin film transistor array panel.

The above information disclosed in this Background section is only for enhancement of understanding of the background of the invention and therefore it may contain information that does not form the prior art that is already known in this country to a person of ordinary skill in the art.

SUMMARY OF CERTAIN INVENTIVE ASPECTS

Embodiments have been made in an effort to provide a display device and a method of manufacturing a display device capable of reducing weight, thickness, costs, and a process time by manufacturing the display device using a single substrate.

In addition, embodiments provide a display device and a method of manufacturing a display device capable of preventing contact between a color filter, a light blocking member, and the like, and a liquid crystal layer, preventing a defect due to level differences between different layers, and simplifying a process.

One embodiment provides a display device including: a substrate including a plurality of pixel areas; a thin film transistor formed on the substrate; a pixel electrode connected to the thin film transistor and formed in the plurality of pixel areas; a roof layer formed on the pixel electrode a plurality of microcavities interposed between the pixel electrode and the roof layer; an injection hole formed in the roof layer, the injection hole configured to expose at least a portion of the plurality of microcavities; a liquid crystal layer filled in at least one of the plurality of microcavities; an encapsulation layer formed on the roof layer, the encapsulation layer configured to cover the injection hole and to seal the plurality of microcavities; and an organic layer formed on the encapsulation layer.

The display device may further include a first valley positioned between adjacent microcavities among the plurality of microcavities, in which the organic layer includes a light blocking member formed in the first valley.

The light blocking member may be further formed at a boundary of a pixel area from the plurality of pixel areas.

The organic layer may further include a color filter formed in at least one of the plurality of pixel areas.

The light blocking member and the color filter may be formed to be overlapped with each other in a partial region.

The display device may further include a color filter formed between the thin film transistor and the pixel electrode, in which the color filter is formed in at least one of the plurality of pixel areas.

The organic layer may include a color filter formed in at least one of the plurality of pixel areas.

The color filter may be further formed at a boundary of at least one of the plurality of pixel areas.

The display device may further include a light blocking member formed between the pixel electrode and the encapsulation layer, in which the light blocking member is formed at a boundary of at least one of the plurality of pixel areas.

The display device may further include a planarization layer formed between the thin film transistor and the pixel electrode.

Another embodiment provides a method of manufacturing a display device, including: forming a thin film transistor on a substrate, the substrate including a plurality of pixel areas; forming a pixel electrode connected to the thin film transistor; forming a sacrificial layer on the pixel electrode; forming a roof layer on the sacrificial layer; forming, by patterning the roof layer, an injection hole configured to expose at least a part of the sacrificial layer; forming, by removing the sacrificial layer, a plurality of microcavities between the pixel electrode and the common electrode; forming a liquid crystal layer by injecting a liquid crystal material into the plurality of microcavities; sealing the plurality of microcavities by forming an encapsulation layer on the roof layer; and forming an organic layer on the encapsulation layer.

A first valley may be positioned between adjacent microcavities from the plurality of microcavities, and the organic layer may include a light blocking member formed in the first valley.

The light blocking member may be further formed at a boundary of at least one of the plurality of pixel areas.

The organic layer may further include a color filter formed in at least one of the plurality of pixel areas.

The light blocking member and the color filter may be formed to be overlapped with each other in a partial region.

The method may further include forming a color filter on the thin film transistor, in which the pixel electrode is formed on the color filter.

The organic layer may include a color filter formed in at least one of the plurality of pixel areas.

The color filter may be further formed at a boundary of at least one of the plurality of pixel areas.

The method may further include forming a light blocking member on the pixel electrode, in which the encapsulation layer is formed on the light blocking member.

The method may further include forming a planarization layer on the thin film transistor, in which the pixel electrode is formed on the planarization layer.

The display device and the method of manufacturing of a display device may reduce weight, thickness, cost, and a process time by manufacturing the display device using a single substrate.

In addition, the organic layers such as the color filter and the light blocking member are formed on the encapsulation layer so as to prevent contact with the liquid crystal layer, thereby improving reliability.

In addition, a defect due to level differences that occur by the color filter and the light blocking member may be prevented, and a process may be simplified.

DETAILED DESCRIPTION OF CERTAIN INVENTIVE EMBODIMENTS

Figure 1:
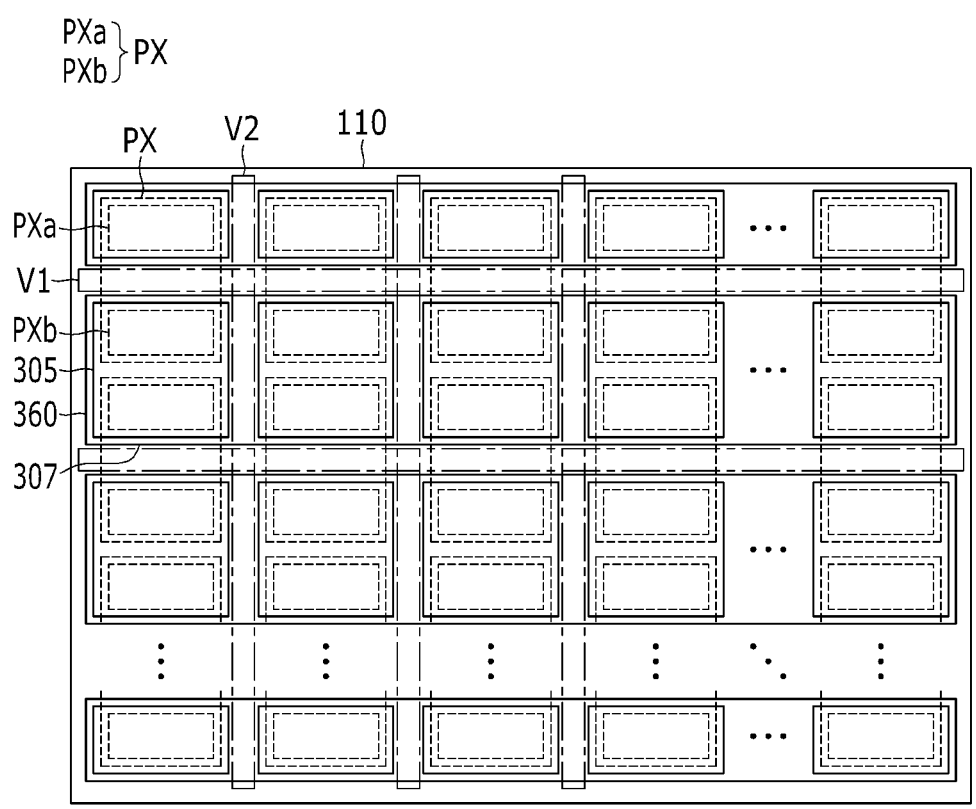
FIG. 1 is a top plan view illustrating a display device according to an embodiment.

The present invention will be described more fully hereinafter with reference to the accompanying drawings, in which certain embodiments of the invention are shown. As those skilled in the art would realize, the described embodiments may be modified in various ways, without departing from the spirit or scope of the present invention.

In the drawings, the thickness of layers, films, panels, regions, and the like, may be exaggerated for clarity. Like reference numerals generally designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

In the liquid crystal display of the related art, because two substrates are essentially used, and respective constituent elements are formed on the two substrates, there are problems in that the display device is heavy and thick, manufacturing costs are high, and long periods of process time are needed.

A display device according to an embodiment will be schematically described with reference to the accompanying drawings.

FIG. 1 is a top plan view illustrating a display device according to an embodiment, and only a part of constituent elements are illustrated in FIG. 1, for convenience.

The display device according to one embodiment includes a substrate 110 made of a material such as, for example, glass or plastic, and a roof layer 360 formed on the substrate 110.

The substrate 110 includes a plurality of pixel areas PX. The plurality of pixel areas PX is disposed in the form of a matrix including a plurality of pixel rows, and a plurality of pixel columns. Each of the pixel areas PX may include a first sub-pixel area PXa, and a second sub-pixel area PXb. The first sub-pixel area PXa and the second sub-pixel area PXb may be disposed above and below one another.

A first valley V1 is positioned along a pixel row direction between the first sub-pixel area PXa and the second sub-pixel area PXb, and a second valley V2 is positioned between a plurality of pixel columns.

The roof layer 360 is formed in the pixel row direction. An injection hole 307 is formed by removing the roof layer 360 in the first valley V1 so that constituent elements positioned under the roof layer 360 may be exposed to the outside.

Each of the roof layers 360 is formed between the adjacent second valleys V2 so as to be spaced apart from the substrate 110, such that a microcavity 305 is formed. In addition, each of the roof layers 360 is formed in the second valley V2 so as to be attached to the substrate 110, such that both sides of the microcavity 305 are covered.

The aforementioned structure of the display device according to one embodiment is merely an example, and various modifications are possible. For example, the disposition forms of the pixel area PX, the first valley V1, and the second valley V2 may be changed, the plurality of roof layers 360 may also be connected to each other in the first valley V1, and a part of the roof layer 360 may be formed in the second valley V2 so as to be spaced apart from the substrate 110 such that the adjacent microcavities 305 may be connected to each other.

Next, one pixel of the display device according to an embodiment will be described with reference to FIGS. 1 to 4.

Figure 2:
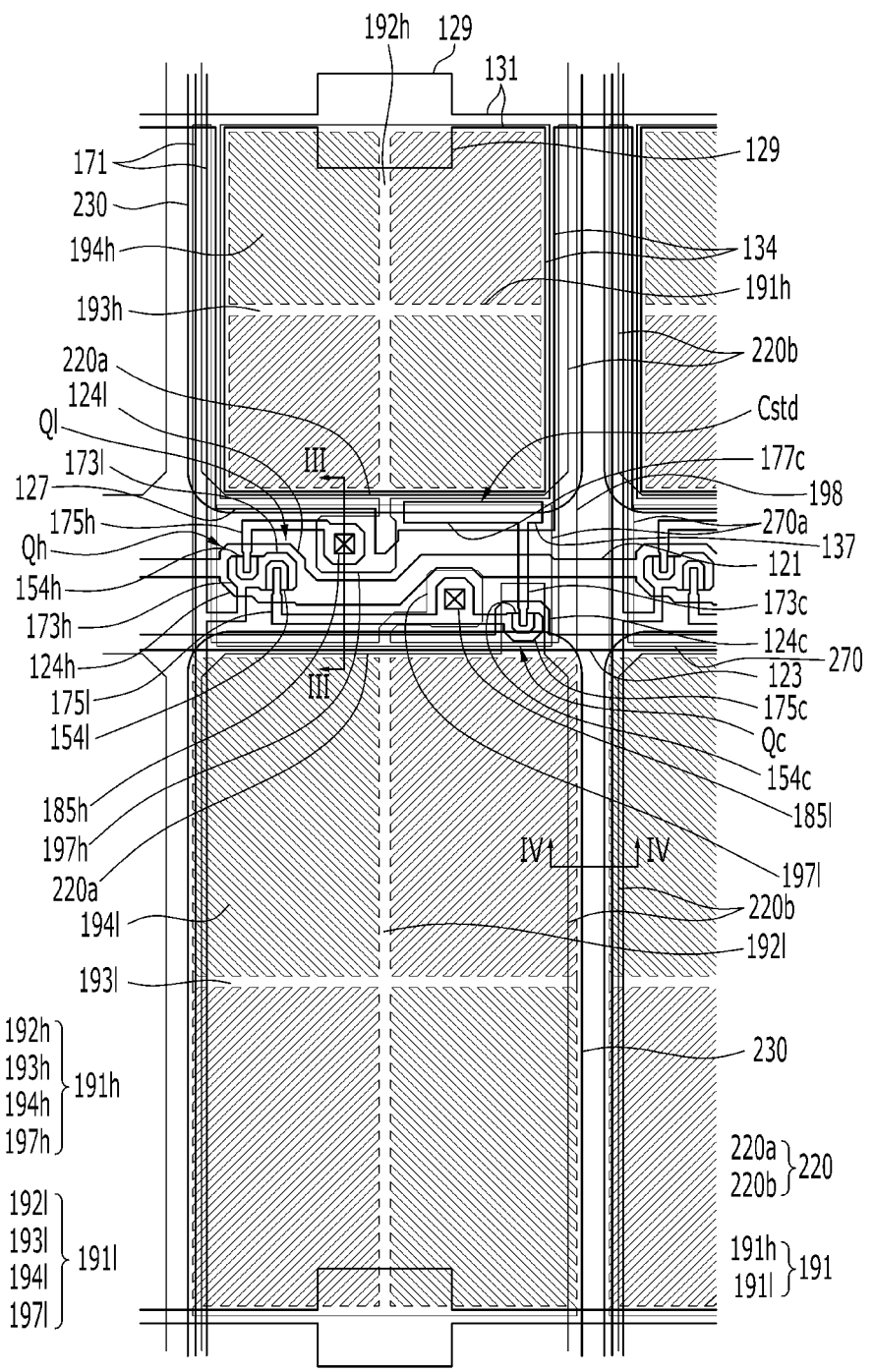
FIG. 2 is a top plan view illustrating one pixel of the display device according to an embodiment.
Figure 3:
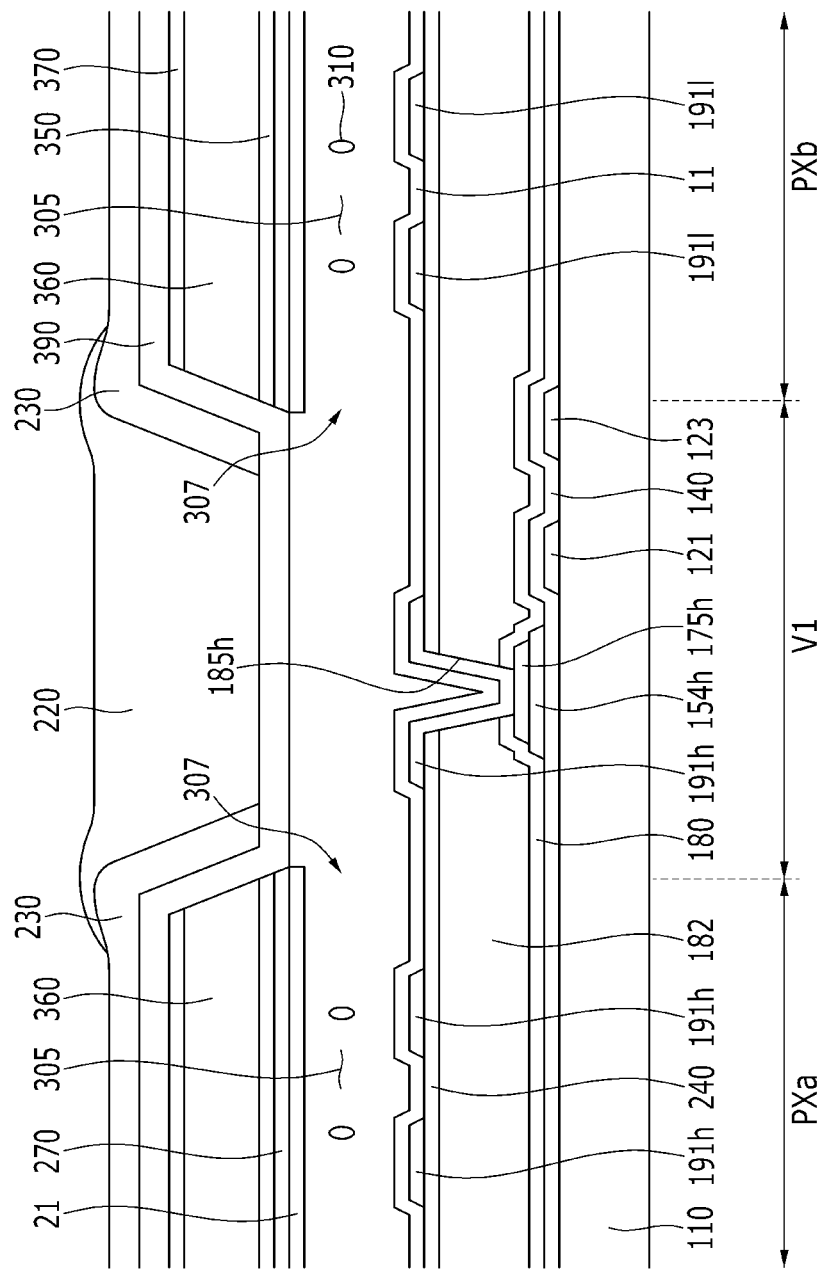
FIG. 3 is a cross-sectional view taken along line III-III of FIG. 2 for illustrating a part of the display device according to an embodiment.
Figure 4:
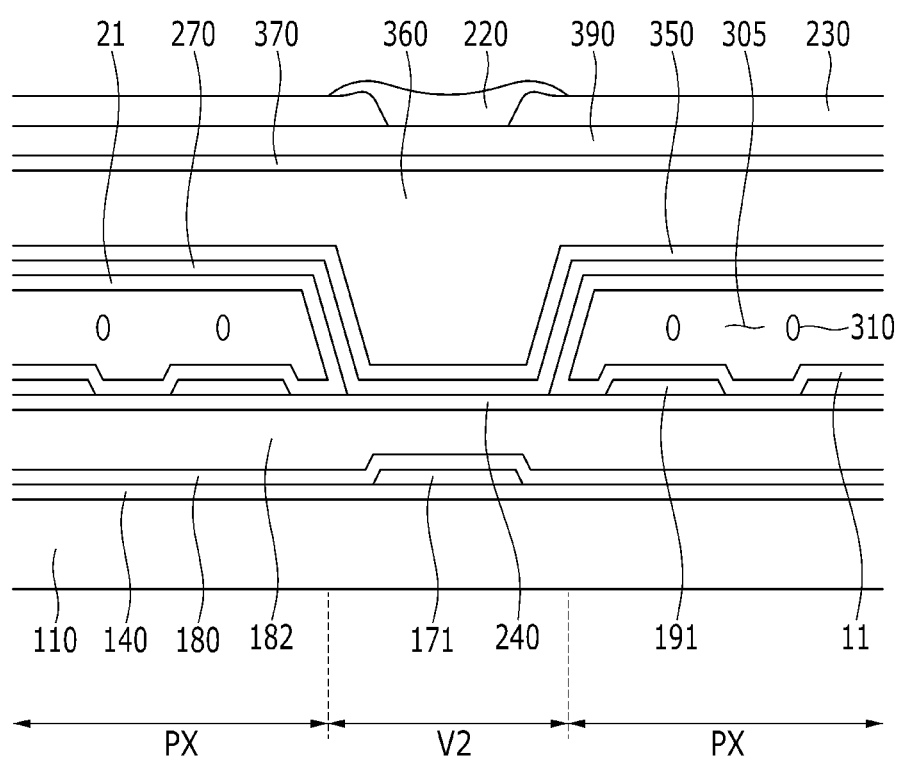
FIG. 4 is a cross-sectional view taken along line IV-IV of FIG. 2 for illustrating a part of the display device according to an embodiment.

FIG. 2 is a top plan view illustrating one pixel of the display device according to an embodiment, FIG. 3 is a cross-sectional view taken along line III-III of FIG. 2 for illustrating a part of the display device according to an embodiment, and FIG. 4 is a cross-sectional view taken along line IV-IV of FIG. 2 for illustrating a part of the display device according to an embodiment.

Referring to FIGS. 1 to 4, a plurality of gate conductors including a plurality of gate lines 121, a plurality of step-down gate lines 123, and a plurality of storage electrode lines 131 are formed on the substrate 110.

The gate line 121 and the step-down gate line 123 are mainly extended in a horizontal direction and transmit gate signals. The gate conductor further includes a first gate electrode 124*h* and a second gate electrode 124*l* that protrude upward and downward from the gate line 121, and further includes a third gate electrode 124*c* that protrudes upward from the step-down gate line 123. The first gate electrode 124*h* and the second gate electrode 124*l* are connected to each other so as to form a single protruding portion. Shapes in which the first, second, and third gate electrodes 124*h*, 124*l*, and 124*c* protrude may be changed.

The storage electrode line 131 is also mainly extended in the horizontal direction, and transmits a predetermined voltage such as a common voltage Vcom. The storage electrode line 131 includes a storage electrode 129 that protrudes upward and downward, a pair of vertical portions 134 that is extended downward so as to be substantially vertical to the gate line 121, and a horizontal portion 127 that connects ends of the pair of vertical portions 134 to each other. The horizontal portion 127 includes a capacity electrode 137 that is enlarged downward.

A gate insulating layer 140 is formed on the gate conductors 121, 123, 124*h*, 124*l*, 124*c*, and 131. The gate insulating layer 140 may be made of an inorganic insulating material such as, for example, a silicon nitride (SiNx) or a silicon oxide (SiOx). In addition, the gate insulating layer 140 may be formed as a single layer or as a multilayer.

A first semiconductor 154*h*, a second semiconductor 154*l*, and a third semiconductor 154*c* are formed on the gate insulating layer 140. The first semiconductor 154*h* may be positioned on the first gate electrode 124*h*, the second semiconductor 154*l* may be positioned on the second gate electrode 124*l*, and the third semiconductor 154*c* may be positioned on the third gate electrode 124*c*. The first semiconductor 154*h* and the second semiconductor 154*l* may be connected to each other, and the second semiconductor 154*l* and the third semiconductor 154*c* may also be connected to each other. In addition, the first semiconductor 154*h* may be formed to be extended to a lower side of the data line 171. The first to third semiconductors 154*h*, 154*l*, and 154*c* may be formed of, for example, amorphous silicon, polycrystalline silicon, metal oxide, or the like.

An ohmic contact (not illustrated) may be further formed on each of the first to third semiconductors 154*h*, 154*l*, and 154*c*. The ohmic contact may be made of a material such as, for example, n+ hydrogenated amorphous silicon into which silicide or n-type impurity is doped at high concentration.

Data conductors including a data line 171, a first source electrode 173*h*, a second source electrode 173*l*, a third source electrode 173*c*, a first drain electrode 175*h*, a second drain electrode 175*l*, and a third drain electrode 175*c* are formed on the first to third semiconductors 154*h*, 154*l*, and 154*c*.

The data line 171 transmits a data signal, and is mainly extended in a vertical direction so as to intersect the gate line 121 and the step-down gate line 123. Each of the data lines 171 includes the first source electrode 173*h* and the second source electrode 173*l* which are extended toward the first gate electrode 124*h* and the second gate electrode 124*l*, and are connected to each other.

The first drain electrode 175*h*, the second drain electrode 175*l*, and the third drain electrode 175*c* include one wide end portion, and another bar-shaped end portion. The bar-shaped end portions of the first drain electrode 175*h* and the second drain electrode 175*l* are partially enclosed by the first source electrode 173*h* and the second source electrode 173*l*. The wide end portion of the second drain electrode 175*l* is extended again and forms the third source electrode 173*c* which is curved in a 'U' shape. A wide end portion 177*c* of the third drain electrode 175*c* is overlapped with the capacity electrode 137 so as to form a step-down capacitor (Cstd), and the bar-shaped end portion thereof is partially enclosed by the third source electrode 173*c*.

The first gate electrode 124*h*, the first source electrode 173*h*, and the first drain electrode 175*h* form a first thin film transistor Qh together with the first semiconductor 154*h*. The second gate electrode 124*l*, the second source electrode 173*l*, and the second drain electrode 175*l* form a second thin film transistor Ql together with the second semiconductor 154*l*. The third gate electrode 124*c*, the third source electrode 173*c*, and the third drain electrode 175*c* form a third thin film transistor Qc together with the third semiconductor 154*c*.

The first semiconductor 154*h*, the second semiconductor 154*l*, and the third semiconductor 154*c* may be connected to each other so as to be formed in a linear shape, and may have substantially the same plane shape together with the data conductors 171, 173*h*, 173*l*, 173*c*, 175*h*, 175*l*, and 175*c* and the ohmic contacts under the data conductors 171, 173*h*, 173*l*, 173*c*, 175*h*, 175*l*, and 175*c*, except for channel regions between the source electrodes 173*h*, 173*l*, and 173*c* and the drain electrodes 175*h*, 175*l*, and 175*c*.

The first semiconductor 154*h* has an exposed portion which is not covered by the first source electrode 173*h* and the first drain electrode 175*h* between the first source electrode 173*h* and the first drain electrode 175*h*. The second semiconductor 154*l* has an exposed portion which is not covered by the second source electrode 173*l* and the second drain electrode 175*l* between the second source electrode 173*l* and the second drain electrode 175*l*. The third semiconductor 154*c* has an exposed portion which is not covered by the third source electrode 173*c* and the third drain electrode 175*c* between the third source electrode 173*c* and the third drain electrode 175*c*.

A passivation layer 180 is formed on the semiconductors 154*h*, 154*l*, and 154*c* which are exposed between the data conductors 171, 173*h*, 173*l*, 173*c*, 175*h*, 175*l*, and 175*c* and the respective source electrodes 173*h*, 173*l*, and 173*c*, and the respective drain electrodes 175*h*, 175*l*, and 175*c*. The passivation layer 180 may be made of an inorganic insulating material such as, for example, a silicon nitride (SiNx) or a silicon oxide (SiOx).

A planarization layer 182 may be further formed on the passivation layer 180. The planarization layer 182 is thickly made of an organic insulating material so as to mitigate level differences that occur by forming the first to third thin film transistors Qh, Ql, and Qc.

A first insulating layer 240 may be further formed on the planarization layer 182. The first insulating layer 240 may be made of an inorganic insulating material such as, for example, a silicon nitride (SiNx) or a silicon oxide (SiOx).

While the configuration in which the passivation layer 180 made of an inorganic insulating material, the planarization layer 182 made of an organic insulating material, and the first insulating layer 240 made of an inorganic insulating material are sequentially laminated on the first to third thin film transistors Qh, Ql, and Qc has been described above, the present invention is not limited thereto. The insulating layer 240, which is formed on the first to third thin film transistors Qh, Ql, and Qc, may be formed as a single layer made of an inorganic insulating material or an organic insulating material, or may be formed as a multilayer by various bonding methods.

A plurality of first contact holes 185*h* and a plurality of second contact holes 185*l*, which expose a wide end portion of the first drain electrode 175*h* and a wide end portion of the second drain electrode 175*l*, respectively, are formed in the first insulating layer 240, the planarization layer 182, and the passivation layer 180.

A pixel electrode 191 is formed on the first insulating layer 240. The pixel electrode 191 may be made of a transparent metallic material such as, for example, an indium-tin oxide (ITO), and an indium-zinc oxide (IZO).

The pixel electrode 191 includes a first sub-pixel electrode 191*h* and a second sub-pixel electrode 191*l* which are separated from each other while interposing the gate line 121 and the step-down gate line 123 therebetween, disposed on and under the pixel area PX on the basis of the gate line 121 and the step-down gate line 123, and adjacent to each other in a column direction. The first sub-pixel electrode 191*h* and the second sub-pixel electrode 191*l* are separated from each other while interposing the first valley V1 therebetween, the first sub-pixel electrode 191*h* is positioned in the first sub-pixel area PXa, and the second sub-pixel electrode 191*l* is positioned in the second sub-pixel area PXb.

The first sub-pixel electrode 191*h* and the second sub-pixel electrode 191*l* are connected to the first drain electrode 175*h* and the second drain electrode 175*l* through the first contact hole 185*h* and the second contact hole 185*l*, respectively. Therefore, in a state in which the first thin film transistor Qh and the second thin film transistor Ql are turned on, a data voltage is applied from the first drain electrode 175*h* and the second drain electrode 175*l*.

Each of the first sub-pixel electrode 191*h* and the second sub-pixel electrode 191*l* is a quadrangular shape, and each of the first sub-pixel electrode 191*h* and the second sub-pixel electrode 191*l* includes a cross-shaped stem portion having horizontal stem portions 193*h* and 193*l*, and vertical stem portions 192*h* and 192*l* which intersect the horizontal stem portions 193*h* and 193*l*. In addition, the first sub-pixel electrode 191*h* and the second sub-pixel electrode 191*l* include protruding portions 197*h* and 197*l* which protrude downward or upward from edge sides of a plurality of minute branch portions 194*h* and 194*l*, and the sub-pixel electrodes 191*h* and 191*l*, respectively.

The pixel electrode 191 is divided into four sub-regions by the horizontal stem portions 193*h* and 193*l* and the vertical stem portions 192*h* and 192*l*. The minute branch portions 194*h* and 194*l* are obliquely extended from the horizontal stem portions 193*h* and 193*l* and the vertical stem portions 192*h* and 192*l*, and the extension direction may form an angle of approximately 45° or 135° with the gate line 121 or the horizontal stem portions 193*h* and 193*l*. In addition, the directions in which the minute branch portions 194*h* and 194*l* of two adjacent sub-regions are extended may be orthogonal to each other.

In one embodiment, the first sub-pixel electrode 191*h* further includes an outline stem portion which encloses an outline, and the second sub-pixel electrode 191*l* further includes horizontal portions positioned at an upper end and a lower end, and left and right vertical portions 198 positioned at a left and right sides of the first sub-pixel electrode 191*h*. The left and right vertical portions 198 may prevent capacitive coupling between the data line 171 and the first sub-pixel electrode 191*h*.

The disposition forms of the pixel area, the structure of the thin film transistor, and the shape of the pixel electrode, which are described above, are merely examples, and various modifications are possible.

A common electrode 270 is formed on the pixel electrode 191 so as to be spaced apart from the pixel electrode 191 at a predetermined distance. The microcavity 305 is formed between the pixel electrode 191 and the common electrode 270. The microcavity 305 is enclosed by the pixel electrode 191 and the common electrode 270. A width and an area of the microcavity 305 may be variously changed in accordance with a size and a resolution of the display device. In some embodiments, the common electrode 270 may be formed to have an insulating layer interposed between the common electrode 270 and the pixel electrode 191. The microcavity 305 may not be formed between the pixel electrode 191 and the common electrode 270, but the microcavity 305 may be formed on the common electrode 270.

The common electrode 270 may be made of a transparent metallic material such as, for example, an indium-tin oxide (ITO), or an indium-zinc oxide (IZO). A predetermined voltage may be applied to the common electrode 270, and an electric field may be formed between the pixel electrode 191 and the common electrode 270.

A first alignment layer 11 is formed on the pixel electrode 191. The first alignment layer 11 may be formed directly on the first insulating layer 240 which is not covered by the pixel electrode 191.

A second alignment layer 21 is formed under the common electrode 270 so as to face the first alignment layer 11.

The first alignment layer 11 and the second alignment layer 21 may be formed as a vertical alignment layer, and made of an alignment material such as, for example, polyamic acid, polysiloxane, or polyimide. The first and second alignment layers 11 and 21 may be connected to each other at an edge of the pixel area PX.

A liquid crystal layer, which is formed of liquid crystal molecules 310, is formed in the microcavity 305 positioned between the pixel electrode 191 and the common electrode 270. The liquid crystal molecules 310 have negative dielectric anisotropy, and may stand on the substrate 110 in a vertical direction in a state in which an electric field is not applied. Vertical alignment may be formed.

The first sub-pixel electrode 191*h* and the second sub-pixel electrode 191*l*, to which a data voltage is applied, produce an electric field together with the common electrode 270, such that a direction of the liquid crystal molecules 310 positioned in the microcavity 305 between the two electrodes 191 and 270 is determined. In accordance with the direction of the liquid crystal molecule 310, which is determined as described above, luminance of a light, which passes through the liquid crystal layer, is varied.

A second insulating layer 350 may be further formed on the common electrode 270. The second insulating layer 350 may be made of an inorganic insulating material such as, for example, a silicon nitride (SiNx) or a silicon oxide (SiOx), and may be omitted as necessary.

The roof layer 360 is formed on the second insulating layer 350. The roof layer 360 may be made of an organic material. The microcavity 305 is formed under the roof layer 360. The roof layer 360 may become hard by a curing process so as to maintain a shape of the microcavity 305. The roof layer 360 is formed to be spaced apart from the pixel electrode 191 while interposing the microcavity 305 therebetween.

The roof layer 360 is formed along the pixel row in each of the pixel areas PX and at each of the second valleys V2, but is not formed in the first valley V1. The roof layer 360 is not formed between the first sub-pixel area PXa and the second sub-pixel area PXb. In each of the first sub-pixel area PXa and the second sub-pixel area PXb, the microcavities 305 are formed under the roof layers 360, respectively. The microcavity 305 is not formed under the roof layer 360 in the second valley V2, but the roof layer 360 is formed to be attached to the substrate 110. Therefore, a thickness of the roof layer 360 positioned in the second valley V2 may be formed to be larger than a thickness of the roof layer 360 positioned in each of the first sub-pixel area PXa and the second sub-pixel area PXb. The microcavity 305 has a form in which an upper surface and both side surfaces thereof are covered by the roof layer 360.

The injection holes 307, which expose a part of the microcavity 305, are formed in the roof layer 360. The injection holes 307 may be formed at edges of the first sub-pixel area PXa and the second sub-pixel area PXb so as to face each other. The injection holes 307 may be formed to expose sides of the microcavity 305 so as to correspond to a lower side of the first sub-pixel area PXa and an upper side of the second sub-pixel area PXb. The microcavity 305 is exposed by the injection holes 307 such that an alignment agent, a liquid crystal material, or the like, may be injected into the microcavity 305 through the injection holes 307.

A third insulating layer 370 may be further formed on the roof layer 360. The third insulating layer 370 may be made of an inorganic insulating material such as, for example, silicon nitride (SiNx) or silicon oxide (SiOx). The third insulating layer 370 may be formed to cover an upper surface and side surfaces of the roof layer 360. The third insulating layer 370 serves to protect the roof layer 360 made of an organic material, and may be omitted as necessary.

An encapsulation layer 390 may be formed on the third insulating layer 370. The encapsulation layer 390 is formed to cover the injection holes 307 which expose a part of the microcavity 305 to the outside. The encapsulation layer 390 may seal the microcavity 305 so that the liquid crystal molecule 310, which is formed in the microcavity 305, is not moved to the outside. Because the encapsulation layer 390 comes into contact with the liquid crystal molecules 310, the encapsulation layer 390 may be made of a material that does not react with the liquid crystal molecules 310. For example, the encapsulation layer 390 may be made of parylene, or the like.

The encapsulation layer 390 may be formed as a multilayer such as a double layer, or a triple layer. The double layer includes two layers made of different materials. The triple layer includes three layers, and materials of the adjacent layers are different from each other. For example, the encapsulation layer 390 may include a layer made of an organic insulating material, and a layer made of an inorganic insulating material.

Organic layers such as a light blocking member 220 and a color filter 230 are formed on the encapsulation layer 390.

The color filter 230 is formed in each of the pixel areas PX. The color filters 230 may be formed in the first sub-pixel area PXa and the second sub-pixel area PXb. Each of the color filters 230 may display one of the primary colors such as, for example, three primary colors of red, green, and blue. The color filter 230 may display cyan, magenta, or yellow, white based colors, and the like, without being limited to the three primary colors of red, green, and blue. Unlike the drawings, the color filter 230 may be formed to be elongated in a column direction along the adjacent data lines 171 and between the adjacent data lines 171.

The light blocking member 220 is formed in a region between the adjacent color filters 230. The light blocking member 220 is formed at boundaries of a plurality of pixel areas PX and on the thin film transistor, and formed in the first valley V1 positioned between the first sub-pixel area PXa and the second sub-pixel area PXb. The light blocking member 220 serves to prevent light leakage.

The light blocking member 220 is extended and enlarged upward and downward along the gate line 121 and the step-down gate line 123, and includes a horizontal light blocking member 220a which covers a region where the first thin film transistor Qh, the second thin film transistor Ql, the third thin film transistor Qc, and the like are positioned, and a vertical light blocking member 220b which is extended along the data line 171. The horizontal light blocking member 220a may be formed in the first valley V1, and the vertical light blocking member 220b may be formed in the second valley V2.

The color filter 230 and the light blocking member 220 may be overlapped with each other in a partial region. For example, the color filter 230 and the light blocking member 220 may be overlapped with each other at a boundary between the first valley V1 and the first sub-pixel area PXa, and at a boundary between the first valley V1 and the second sub-pixel area PXb. A state in which the light blocking member 220 is formed more upward than the color filter 230 in the region where the color filter 230 and the light blocking member 220 are overlapped is illustrated. In some embodiments, the color filter 230 may be formed more upward than the light blocking member 220 in the region where the color filter 230 and the light blocking member 220 are overlapped.

In a case in which the color filter 230 and the light blocking member 220 are formed under the pixel electrode 191, reliability may deteriorate due to contact with the liquid crystal molecules 310, and a defect due to level differences may occur when the alignment agent or the liquid crystal material is injected. In addition, because the light blocking members 220 are formed on and under the pixel electrode, a process is performed twice. In some embodiments, the color filter 230 and the light blocking member 220 are formed on the encapsulation layer 390 such that reliability may be improved by preventing contact with the liquid crystal molecules 310, an injection defect due to level differences between the color filter 230 and the light blocking member 220 may be solved, and a process may be simplified by forming the light blocking member 220 with a single process.

Although not illustrated, polarizers may be further formed on upper and lower surfaces of the display device. The polarizer may include a first polarizer, and a second polarizer. The first polarizer may be attached to a lower surface of the substrate 110, and the second polarizer may be attached on the color filter 230 and the light blocking member 220.

Next, a method of manufacturing the display device according to an embodiment will be described with reference to FIGS. 5 to 10. Moreover, the method will be described with reference to FIGS. 1 to 4.

FIGS. 5 to 10 are process cross-sectional views illustrating a method of manufacturing the display device according to an embodiment.

Figure 5:
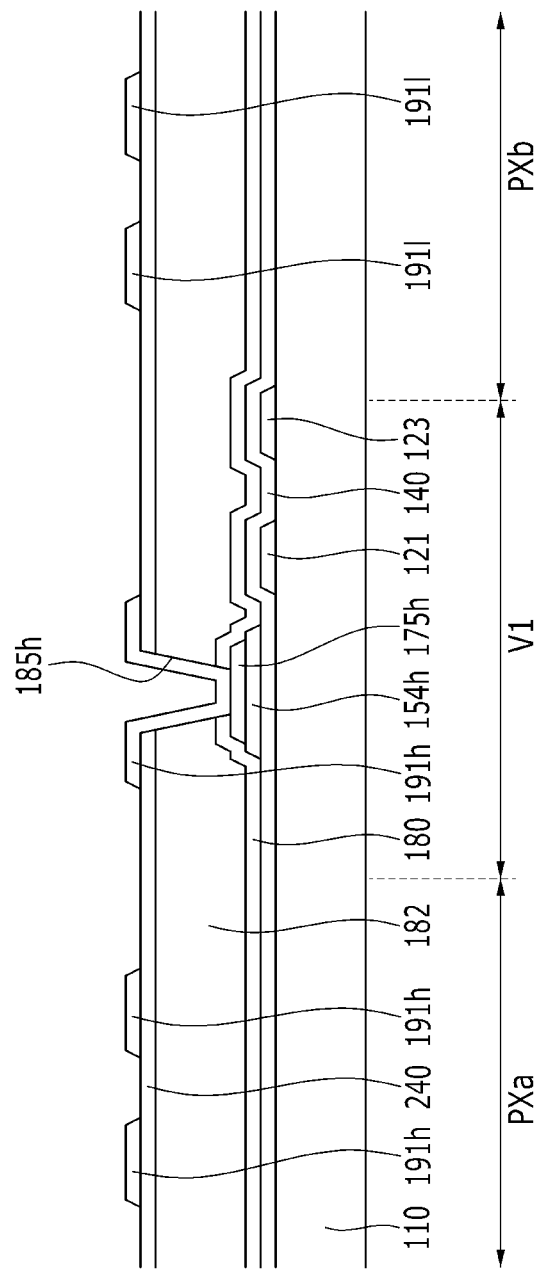
FIGS. 5 to 10 are process cross-sectional views illustrating a method of manufacturing the display device according to an embodiment.

First, as illustrated in FIG. 5, the gate line 121 and the step-down gate line 123, which are extended in one direction, are formed on the substrate 110 made of glass, plastic, or the like, and then the first gate electrode 124h, the second gate electrode 124l, and the third gate electrode 124c, which protrude from the gate line 121, are formed.

In addition, the storage electrode line 131 may be also be formed so as to be spaced apart from the gate line 121, the step-down gate line 123, and the first to third gate electrodes 124h, 124l, and 124c.

Next, using an inorganic insulating material such as, for example, a silicon oxide (SiOx), or a silicon nitride (SiNx), the gate insulating layer 140 is formed on the entire surface of the substrate 110 including the gate line 121, the step-down gate line 123, the first to third gate electrodes 124h, 124l, and 124c, and the storage electrode line 131. The gate insulating layer 140 may be formed as a single layer, or a multilayer.

Next, a semiconductor material such asm for example, amorphous silicon, polycrystalline silicon, or a metal oxide is deposited on the gate insulating layer 140, and thereafter, the deposited semiconductor material is patterned to form the first semiconductor 154h, the second semiconductor 154l, and the third semiconductor 154c. The first semiconductor 154h may be formed to be positioned on the first gate electrode 124h, the second semiconductor 154l may be formed to be positioned on the second gate electrode 124l, and the third semiconductor 154c may be formed to be positioned on the third gate electrode 124c.

Next, a metallic material is deposited and patterned so as to form the data line 171 that is extended in the other direction. The metallic material may be formed as a single layer, or a multilayer.

In addition, the first source electrode 173h which protrudes on the first gate electrode 124h from the data line 171, and the first drain electrode 175h which is spaced apart from the first source electrode 173h are formed together. In addition, the second source electrode 173l which is connected to the first source electrode 173h, and the second drain electrode 175l which is spaced apart from the second source electrode 173l are formed together. In addition, the third source electrode 173c which is extended from the second drain electrode 175l, and the third drain electrode 175c which is spaced apart from the third source electrode 173c are formed together.

The semiconductor material and the metallic material may be continuously deposited and simultaneously patterned so as to form the first to third semiconductors 154h, 154l, and 154c, the data line 171, the first to third source electrodes 173h, 173l, and 173c, and the first to third drain electrodes 175h, 175l, and 175c. The first semiconductor 154h is formed to be extended to a lower side of the data line 171.

The first, second, and third gate electrodes 124h, 124l, and 124c, the first, second, and third source electrodes 173h, 173l, and 173c, and the first, second, and third drain electrodes 175h, 175l, and 175c configure the first, second, and third thin film transistors (TFTs) Qh, Ql, and Qc, respectively, together with the first, second, and third semiconductors 154h, 154l, and 154c.

Next, the passivation layer 180 is formed on the data line 171, the first to third source electrodes 173h, 173l, and 173c, the first to third drain electrodes 175h, 175l, and 175c, and the semiconductors 154h, 154l, and 154c that are exposed between the respective source electrodes 173h, 173l, and 173c and the respective drain electrodes 175h, 175l, and 175c. The passivation layer 180 may be made of an inorganic insulating material such as, for example, a silicon nitride (SiNx) or a silicon oxide (SiOx).

Next, the planarization layer 182 may be further formed on the passivation layer 180. The planarization layer 182 is thickly made of an organic insulating material so as to mitigate level differences that occur by forming the first to third thin film transistors Qh, Ql, and Qc.

Next, the first insulating layer 240 may be further formed on the planarization layer 182. The first insulating layer 240 may be made of an inorganic insulating material such as, for example, a silicon nitride (SiNx) or a silicon oxide (SiOx).

While the process in which the passivation layer 180 made of an inorganic insulating material, the planarization layer 182 made of an organic insulating material, and the first insulating layer 240 made of an inorganic insulating material are sequentially laminated and formed on the first to third thin film transistors Qh, Ql, and Qc has been described above, the present invention is not limited thereto. The insulating layer 240, which is formed on the first to third thin film transistors Qh, Ql, and Qc, may be formed as a single layer made of an inorganic insulating material or an organic insulating material, or may be formed as a multilayer by various bonding methods.

Next, by etching the first insulating layer 240, the planarization layer 182, and the passivation layer 180, the first contact hole 185h is formed so that a part of the first drain electrode 175h is exposed, and the second contact hole 185l is formed so that a part of the second drain electrode 175l is exposed.

Next, a transparent metallic material such as, for example, an indium-tin oxide (ITO) or an indium-zinc oxide (IZO) is deposited and patterned on the first insulating layer 240, such that the first sub-pixel electrode 191h is formed in the first sub-pixel area PXa, and the second sub-pixel electrode 191l is formed in the second sub-pixel area PXb. The first sub-pixel electrode 191h and the second sub-pixel electrode 191l are separated from each other while interposing the first valley V1 therebetween. The first sub-pixel electrode 191h is formed to be connected to the first drain electrode 175h through the first contact hole 185h, and the second sub-pixel electrode 191l is formed to be connected to the second drain electrode 175l through the second contact hole 185l.

The horizontal stem portions 193h and 193l (not shown), and the vertical stem portions 192h and 192l (not shown), which intersect the horizontal stem portions 193h and 193l, are formed in the first sub-pixel electrode 191h and the second sub-pixel electrode 191l, respectively. In addition, the plurality of minute branch portions 194h and 194l (not shown), which is obliquely extended from the horizontal stem portions 193h and 193l and the vertical stem portions 192h and 192l, is formed.

Figure 6:
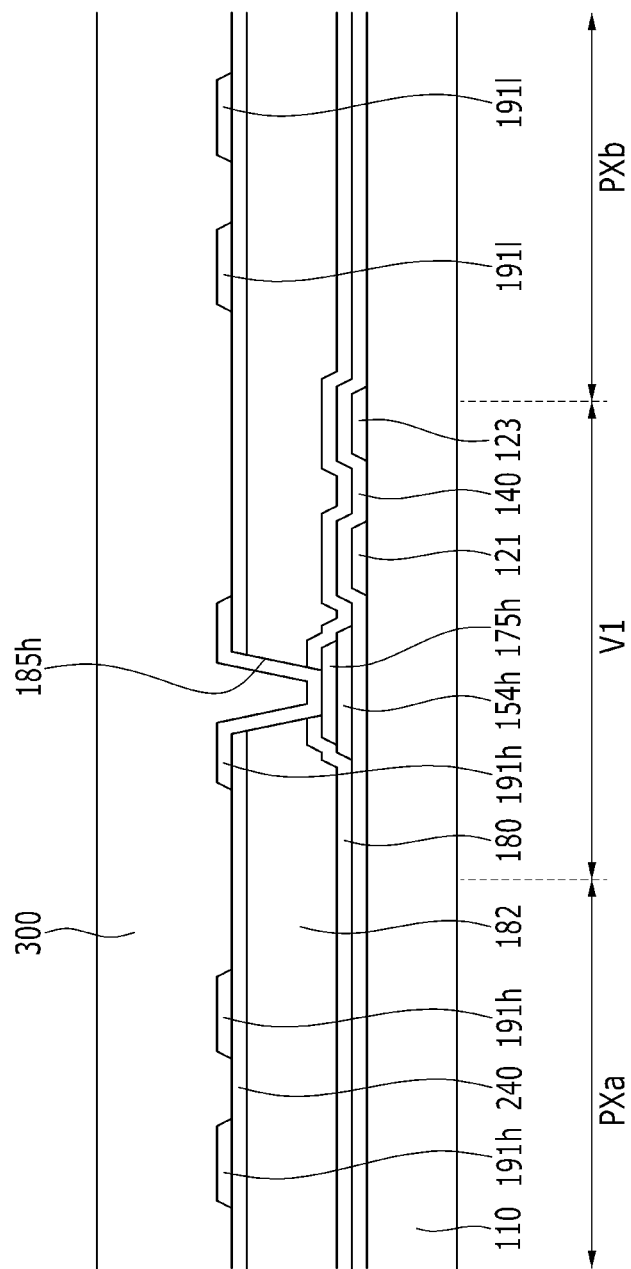

As illustrated in FIG. 6, a photosensitive organic material is applied on the pixel electrode 191, and a sacrificial layer 300 is formed by a photo process.

The sacrificial layer 300 is formed to be connected along the plurality of pixel columns. That is, the sacrificial layer 300 is formed to cover each of the pixel areas PX, and formed to cover the first valley V1 positioned between the first sub-pixel area PXa and the second sub-pixel area PXb.

Figure 7:
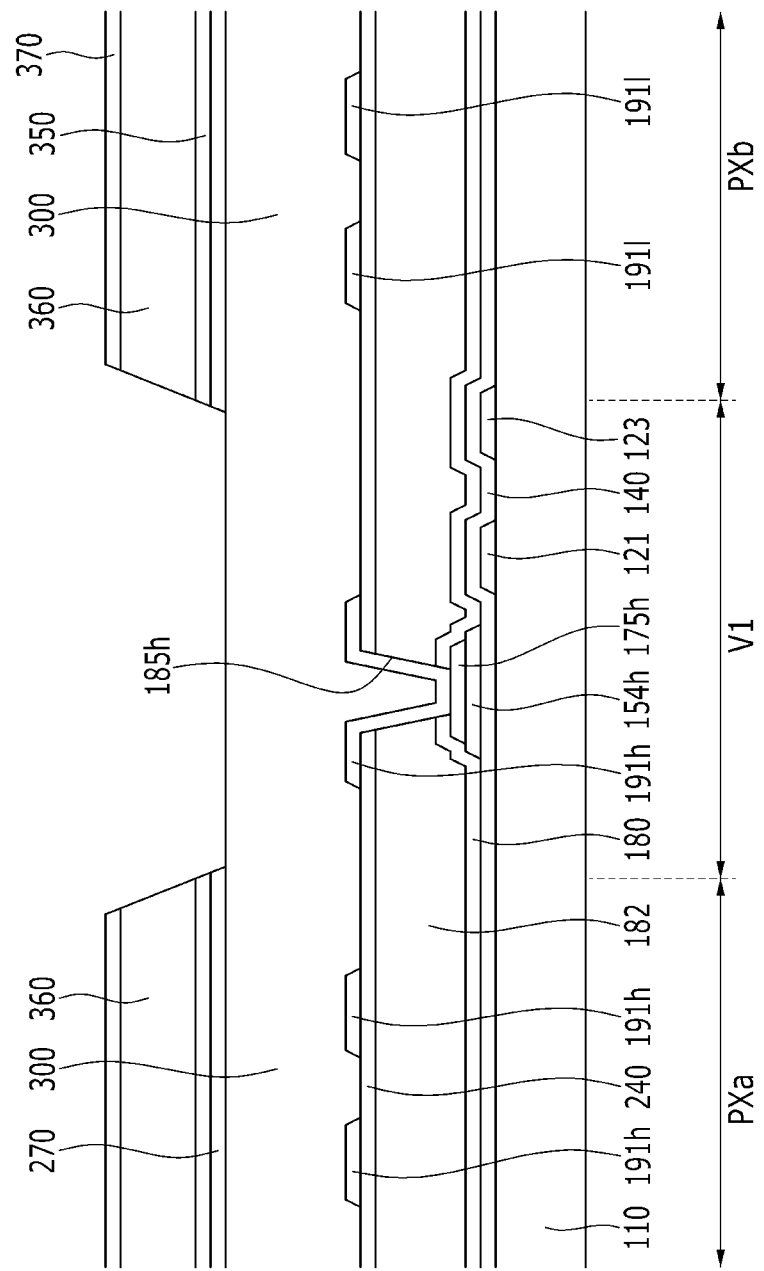

As illustrated in FIG. 7, a transparent metallic material such as an indium-tin oxide (ITO), or an indium-zinc oxide (IZO) is deposited on the sacrificial layer 300 so as to form the common electrode 270.

Next, with an inorganic insulating material such as a silicon oxide, or a silicon nitride, the second insulating layer 350 may be formed on the common electrode 270.

Next, an organic material is applied and patterned on the second insulating layer 350 so as to form the roof layer 360. Here, the organic material may be patterned so that the organic material positioned in the first valley V1 is removed. Accordingly, the roof layer 360 has a form in which the roof layer 360 is connected along the plurality of pixel rows.

Next, the second insulating layer 350 and the common electrode 270 are patterned by using the roof layer 360 as a mask so as to remove the second insulating layer 350 and the common electrode 270 positioned in the first valley V1.

Next, with an inorganic insulating material such as a silicon nitride (SiNx) or a silicon oxide (SiOx), the third insulating layer 370 may be formed on the roof layer 360. The third insulating layer 370 is patterned so as to remove the third insulating layer 370 positioned in the first valley V1. At this time, as illustrated, the third insulating layer 370 may be patterned so that the third insulating layer 370 is not formed at sides of the roof layer 360. Unlike the aforementioned process, the third insulating layer 370 may be patterned so that the third insulating layer 370 covers the sides of the roof layer 360.

The roof layer 360, the second insulating layer 350, the common electrode 270, and the third insulating layer 370 are patterned such that the sacrificial layer 300 positioned in the first valley V1 is exposed to the outside.

Figure 8:
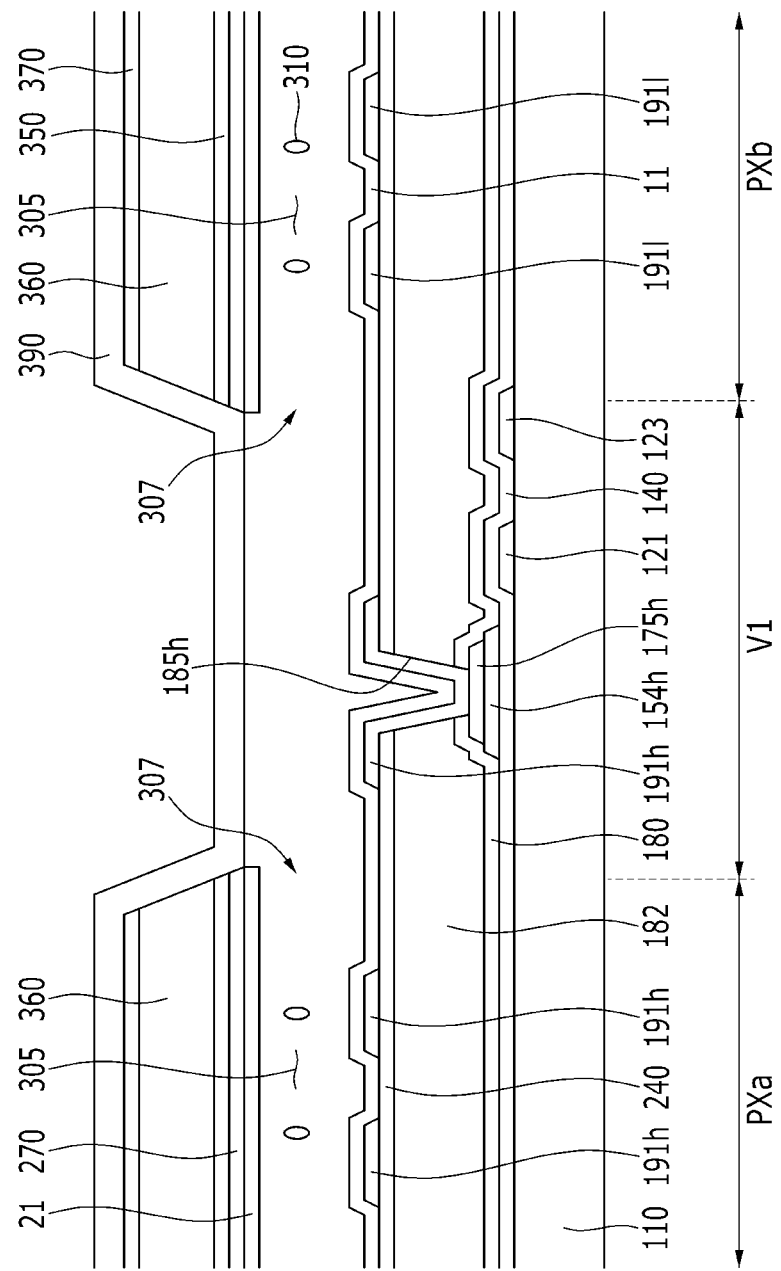

As illustrated in FIG. 8, the entire sacrificial layer 300 is removed by supplying a developer, a stripper solution, or the like on the substrate 110 where the sacrificial layer 300 is exposed, or the entire sacrificial layer 300 is removed using an ashing process.

When the sacrificial layer 300 is removed, the microcavity 305 is formed at a place where the sacrificial layer 300 was positioned.

The pixel electrode 191 and the common electrode 270 are spaced apart from each other while interposing the microcavity 305 therebetween, and the pixel electrode 191 and the roof layer 360 are spaced apart from each other while interposing the microcavity 305 therebetween. The common electrode 270 and the roof layer 360 are formed to cover the upper surface and both side surfaces of the microcavity 305.

The microcavity 305 is exposed to the outside through portions where the roof layer 360 and the common electrode 270 are removed, and the portions are referred to as the injection holes 307. The injection holes 307 are formed along the first valley V1. For example, the injection holes 307 may be formed to face each other at the edges of the first sub-pixel area PXa and the second sub-pixel area PXb. The injection hole 307 may be formed to expose the sides of the microcavity 305 so as to correspond to the lower side of the first sub-pixel area PXa and the upper side of the second sub-pixel area PXb. Unlike the aforementioned configuration, the injection hole 307 may also be formed along the second valley V2.

Next, the roof layer 360 is cured by heating the substrate 110. This is to allow a shape of the microcavity 305 to be maintained by the roof layer 360.

Next, when an alignment agent including an alignment material is dropped on the substrate 110 in a spin coating manner or an inkjet manner, the alignment agent is injected into the microcavity 305 through the injection holes 307. When the alignment agent is injected into the microcavity 305, and thereafter, a curing process is performed, a solution substance evaporates, and the alignment material remains on wall surfaces in the microcavity 305.

Therefore, the first alignment layer 11 may be formed on the pixel electrode 191, and the second alignment layer 21 may be formed under the common electrode 270. The first alignment layer 11 and the second alignment layer 21 are formed to face each other while interposing the microcavity 305 therebetween, and formed to be connected to each other at the edge of the pixel area PX.

The first and second alignment layers 11 and 21 may be aligned in the vertical direction to the substrate 110 except for the sides of the microcavity 305. A process of irradiating an UV to the first and second alignment layers 11 and 21 is additionally performed so that the first and second alignment layers 11 and 21 may be aligned in the horizontal direction to the substrate 110.

Next, when a liquid crystal material is dropped on the substrate 110 in an inkjet manner or a dispensing manner, the liquid crystal material is injected into the microcavity 305 through the injection holes 307. At this time, the liquid crystal material may be dropped into the injection hole 307 formed along the odd numbered first valley V1, but may not be dropped into the injection hole 307 formed along the even numbered first valley V1. In contrast, the liquid crystal material may be dropped into the injection hole 307 formed along the even numbered first valley V1, but may not be dropped into the injection hole 307 formed along the odd numbered first valley V1.

When the liquid crystal material is dropped into the injection holes 307 formed along the odd numbered first valley V1, the liquid crystal material is moved into the microcavity 305 through the injection holes 307 by capillary force. At this time, air in the microcavity 305 is moved out through the injection holes 307 formed along the even numbered first valley V1 such that the liquid crystal material is moved into the microcavity 305.

In addition, the liquid crystal material may be dropped into all of the injection holes 307. That is, the liquid crystal material may be dropped into both the injection holes 307 formed along the odd numbered first valley V1 and the injection holes 307 formed along the even numbered first valley V1.

Next, the encapsulation layer 390 is formed on the third insulating layer 370 by depositing a material that does not react with the liquid crystal molecules 310. The encapsulation layer 390 is formed so that the microcavity 305 covers the injection holes 307 which is exposed to the outside, and seals the microcavity 305.

Figure 9:
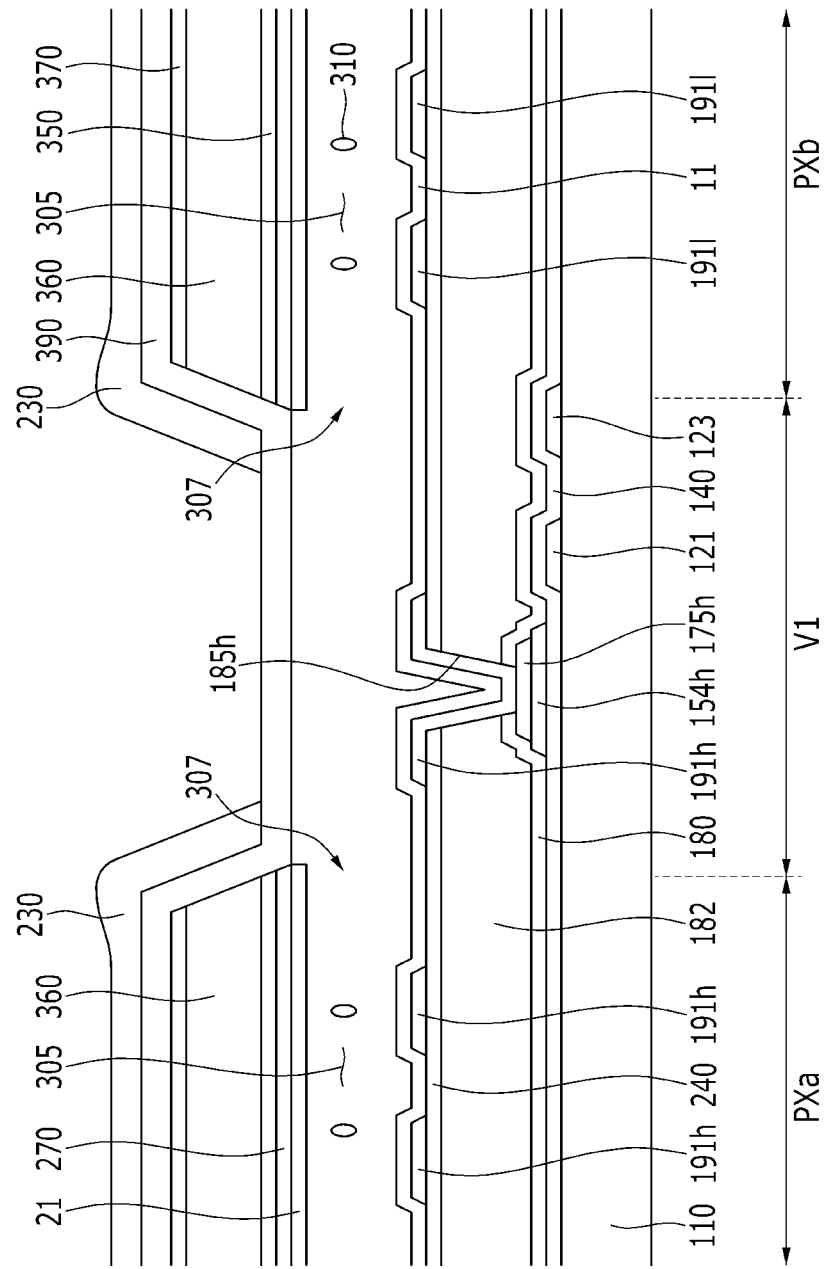

As illustrated in FIG. 9, the color filter 230 is formed in each of the pixel areas PX on the encapsulation layer 390. The color filter 230 is formed in each of the first sub-pixel area PXa and the second sub-pixel area PXb, but may not be formed in the first valley V1. In addition, the color filters 230 having the same color may be formed along a column direction of the plurality of pixel areas PX. In a case in which the color filters 230 having three colors are formed, the color filter 230 having a first color is formed first, and then the color filter 230 having a second color may be formed by shifting a mask. Next, after the color filter 230 having the second color is formed, the color filter 230 having a third color may be formed by shifting the mask again.

Figure 10:
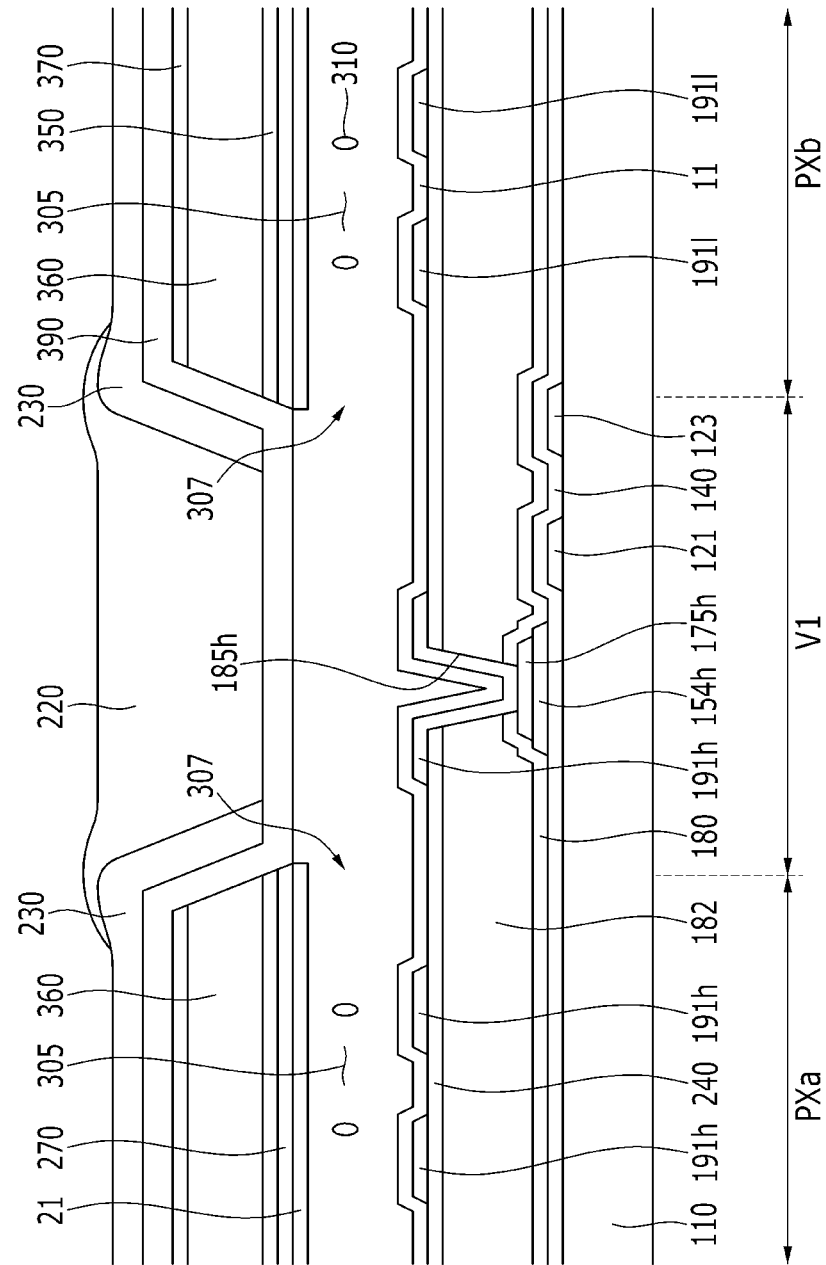

As illustrated in FIG. 10, the light blocking member 220 is formed at the boundary of each of the pixel areas PX on the encapsulation layer 390 and on the thin film transistor, and the light blocking member 220 is formed in the first valley V1 positioned between the first sub-pixel area PXa and the second sub-pixel area PXb.

The color filter 230 and the light blocking member 220 are the organic layers formed on the encapsulation layer 390, and may be formed to be overlapped with each other in a partial region. For example, the color filter 230 and the light blocking member 220 may be formed to be overlapped with each other at a boundary between the first valley V1 and the first sub-pixel area PXa, and at a boundary between the first valley V1 and the second sub-pixel area PXb.

While the process in which the color filter 230 is formed, and then the light blocking member 220 is formed has been described above, the present invention is not limited thereto, and the light blocking member 220 may be formed first, and then the color filter 230 may be formed.

Next, although not illustrated, the polarizers may be further attached to the upper and lower surfaces of the display device. The polarizers may include the first polarizer and the second polarizer. The first polarizer may be attached to the lower surface of the substrate 110, and the second polarizer may be attached on the color filter 230 and the light blocking member 220.

Next, a display device according to another embodiment will be described with reference to FIG. 11. Moreover, the display device will be described with reference to FIGS. 1 and 2.

Figure 11:
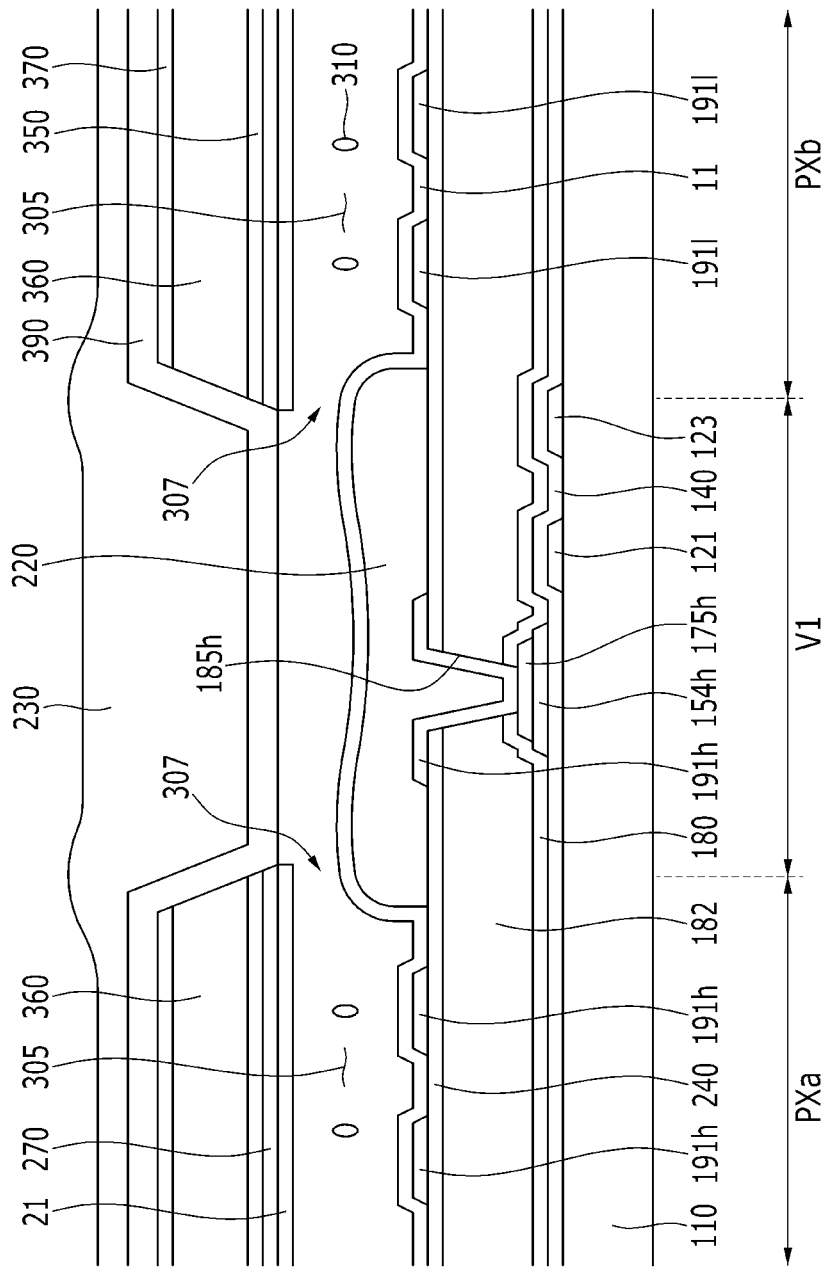
FIG. 11 is a cross-sectional view illustrating a part of a display device according to an embodiment.

Because the display device illustrated in FIG. 11 has a lot of the same elements as those of the display device illustrated in FIGS. 1 to 4, a description thereof will be omitted. The embodiment of FIG. 11 is different in that the light blocking member is formed under the encapsulation layer, and this difference will be described hereinafter in more detail.

FIG. 11 is a cross-sectional view illustrating a part of the display device according to another embodiment.

In the display device, first to third thin film transistors Qh, Ql, and Qc are formed on a substrate 110, and first and second sub-pixel electrodes 191h and 191l are formed to be connected to the first and second thin film transistors Qh and Ql, respectively.

A light blocking member 220 is formed on the first and second sub-pixel electrodes 191h and 191l. The light blocking member 220 is formed at boundaries of a plurality of pixel areas PX and on the thin film transistor, and formed in a first valley V1 positioned between a first sub-pixel area PXa and a second sub-pixel area PXb so as to serve to prevent light leakage.

Roof layers 360 are formed on the first and second sub-pixel electrodes 191h and 191l so as to be spaced apart from the first and second sub-pixel electrodes 191h and 191l while interposing a plurality of microcavities 305 therebetween. Injection holes 307 are formed in the roof layer 360 so as to expose a part of the microcavity 305, and a liquid crystal layer, which is formed of liquid crystal molecules 310, is formed in the microcavity 305.

An encapsulation layer 390 is formed on the roof layers 360 so as to cover the injection holes 307, and seals the microcavity 305. The encapsulation layer 390 is formed on the light blocking member 220.

An organic layer such as a color filter 230 is formed on the encapsulation layer 390. The light blocking member 220 formed under the encapsulation layer 390 and the color filter 230 formed on the encapsulation layer 390 may be formed to be overlapped with each other. For example, as illustrated, the color filter 230 may be formed to be overlapped with the entire light blocking member 220. Unlike the aforementioned configuration, the color filter 230 may be formed to be overlapped with a part of an edge of the light blocking member 220.

The color filter 230 is formed in each of the pixel areas PX. The color filters 230 may be formed in the first sub-pixel area PXa and the second sub-pixel area PXb. Each of the color filters 230 may display one of the primary colors such as, for example, three primary colors of red, green, and blue. The color filter 230 may display cyan, magenta, or yellow, white based colors, and the like without being limited to the three primary colors of red, green, and blue. Unlike the drawings, the color filter 230 may be formed to be elongated in a column direction along the adjacent data lines 171 and between the adjacent data lines 171.

Next, a method of manufacturing the display device according to another embodiment will be described with reference to FIGS. 12 to 16. Moreover, the method will be described with reference to FIGS. 1 and 2.

FIGS. 12 to 16 are process cross-sectional views illustrating a method of manufacturing the display device according to another embodiment.

Figure 12:
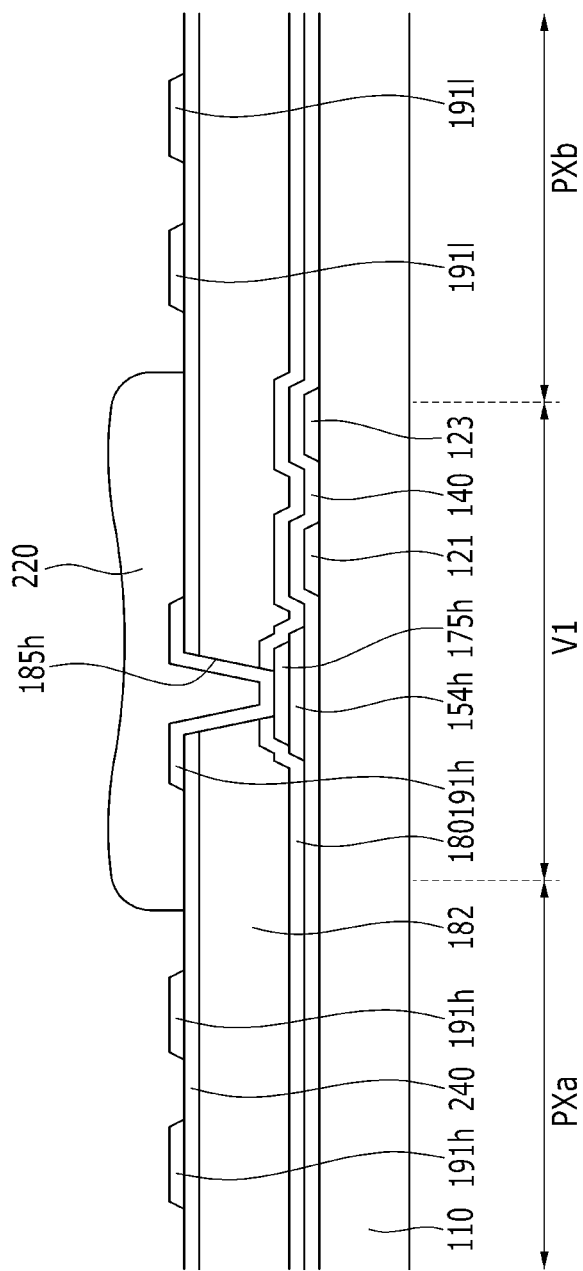
FIGS. 12 to 16 are process cross-sectional views illustrating a method of manufacturing the display device according to an embodiment.

First, as illustrated in FIG. 12, the first to third thin film transistors Qh, Ql, and Qc are formed on the substrate 110, and the first and second sub-pixel electrodes 191h and 191l are formed to be connected to the first and second thin film transistors Qh and Ql, respectively.

Next, the light blocking member 220 is formed on the first and second sub-pixel electrodes 191h and 191l. The light blocking member 220 is formed at the boundary of each of the pixel areas PX and on the thin film transistor, and may be formed in the first valley V1 positioned between the first sub-pixel area PXa and the second sub-pixel area PXb.

Figure 13:
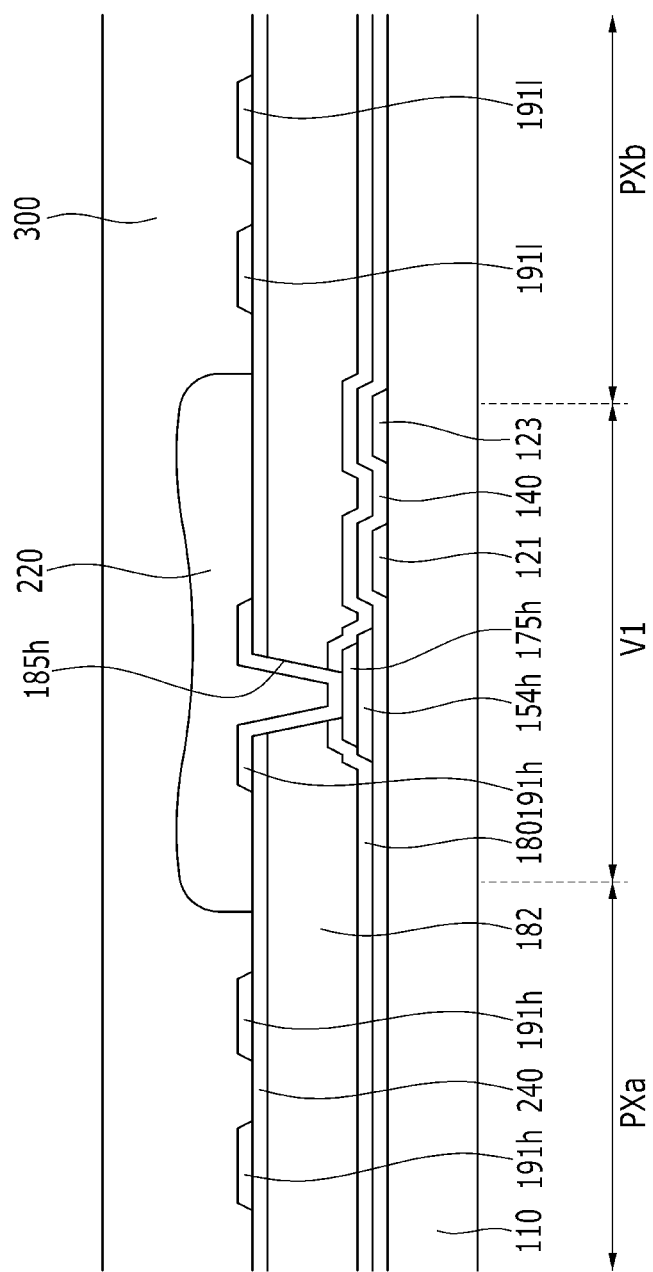

As illustrated in FIG. 13, a sacrificial layer 300 is formed on the first and second sub-pixel electrodes 191h and 191l, and the light blocking member 220.

Figure 14:
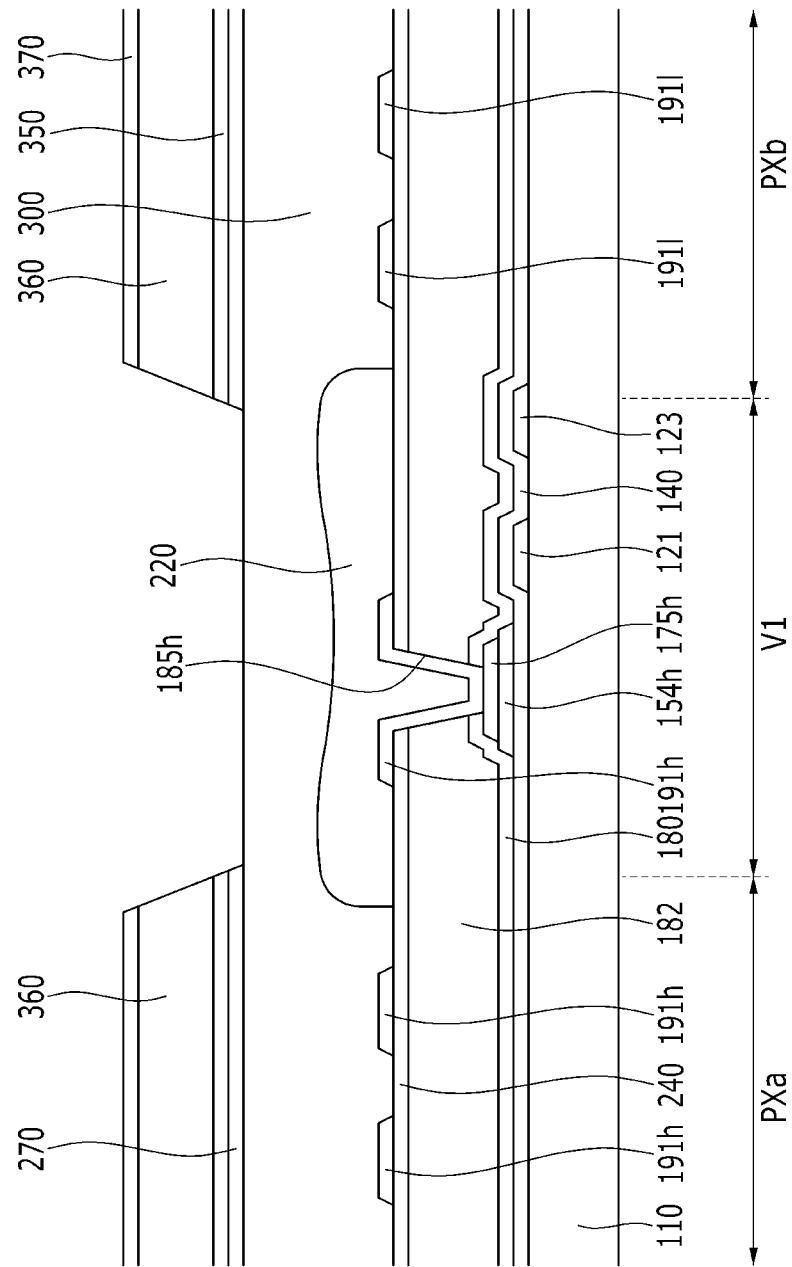

As illustrated in FIG. 14, a common electrode 270, a second insulating layer 350, the roof layer 360, and a third insulating layer 370 are formed on the sacrificial layer 300, and the common electrode 270, the second insulating layer 350, the roof layer 360, and the third insulating layer 370 are simultaneously or individually patterned so as to remove the common electrode 270, the second insulating layer 350, the roof layer 360, and the third insulating layer 370, which are positioned in the first valley V1.

Figure 15:
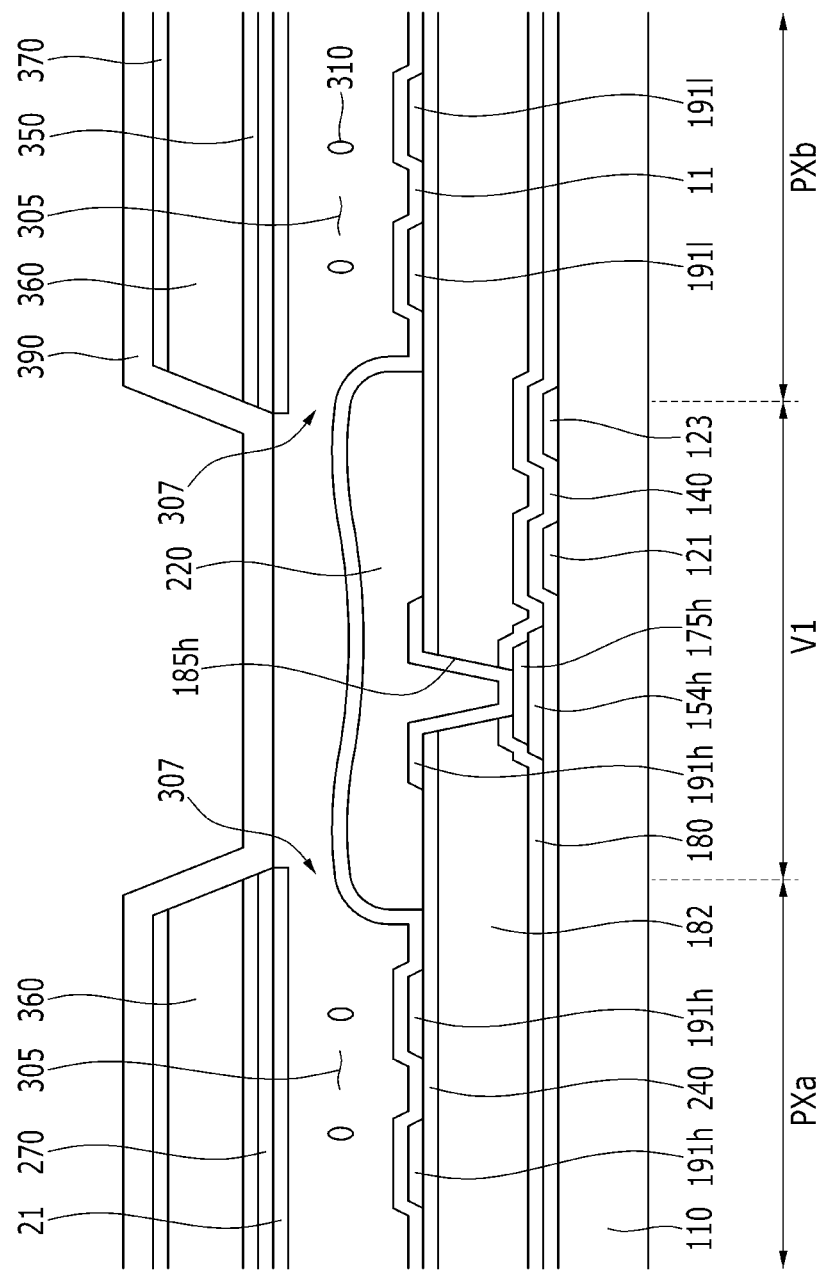

As illustrated in FIG. 15, the sacrificial layer 300 is removed to form the microcavity 305, and an alignment agent is injected into the microcavity 305 through the injection holes 307 so as to form first and second alignment layers 11 and 21.

Next, a liquid crystal material is injected into the microcavity 305 through the injection holes 307 so as to form the liquid crystal layer formed of liquid crystal molecules 310.

Next, the encapsulation layer 390 is formed on the third insulating layer 370 so as to seal the microcavity 305. The encapsulation layer 390 is formed on the light blocking member 220.

Figure 16:
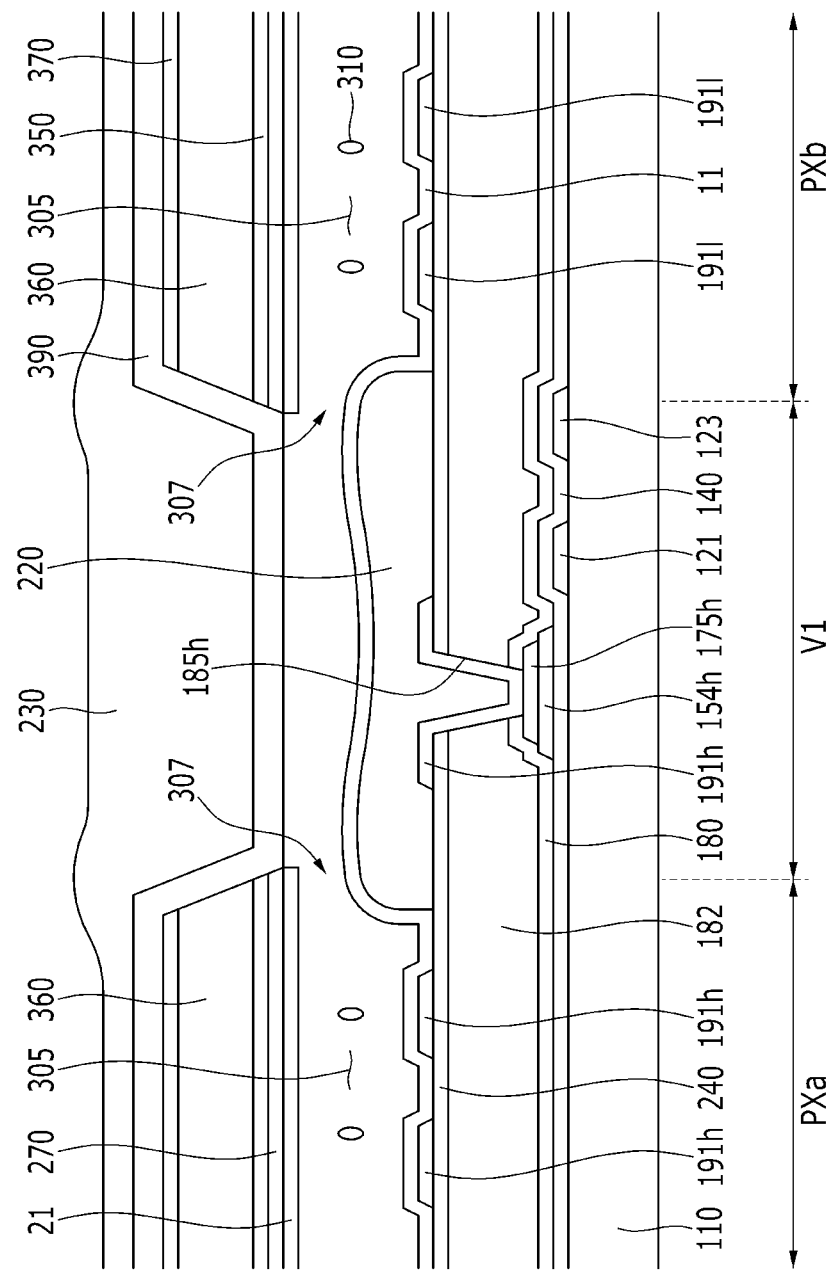

As illustrated in FIG. 16, the organic layer formed as the color filter 230 is formed on the encapsulation layer 390. The color filter 230 is formed in each of the first sub-pixel area PXa and the second sub-pixel area PXb, and may also be formed in the first valley V1. The color filter 230 may be formed to be overlapped with the entire light blocking member 220. Unlike the aforementioned configuration, by removing a part or the entirety of the color filter 230, which is formed in the first valley V1, the color filter 230 may be formed to be overlapped with a part of an edge of the light blocking member 220.

The color filters 230 having the same color may be formed along a column direction of the plurality of pixel areas PX. In a case in which the color filters 230 having three colors are formed, the color filter 230 having a first color is formed first, and then the color filter 230 having a second color may be formed by shifting a mask. Next, after the color filter 230 having the second color is formed, the color filter 230 having a third color may be formed by shifting the mask again.

Next, a display device according to another embodiment will be described with reference to FIG. 17. Moreover, the display device will be described with reference FIGS. 1 to 4.

Figure 17:
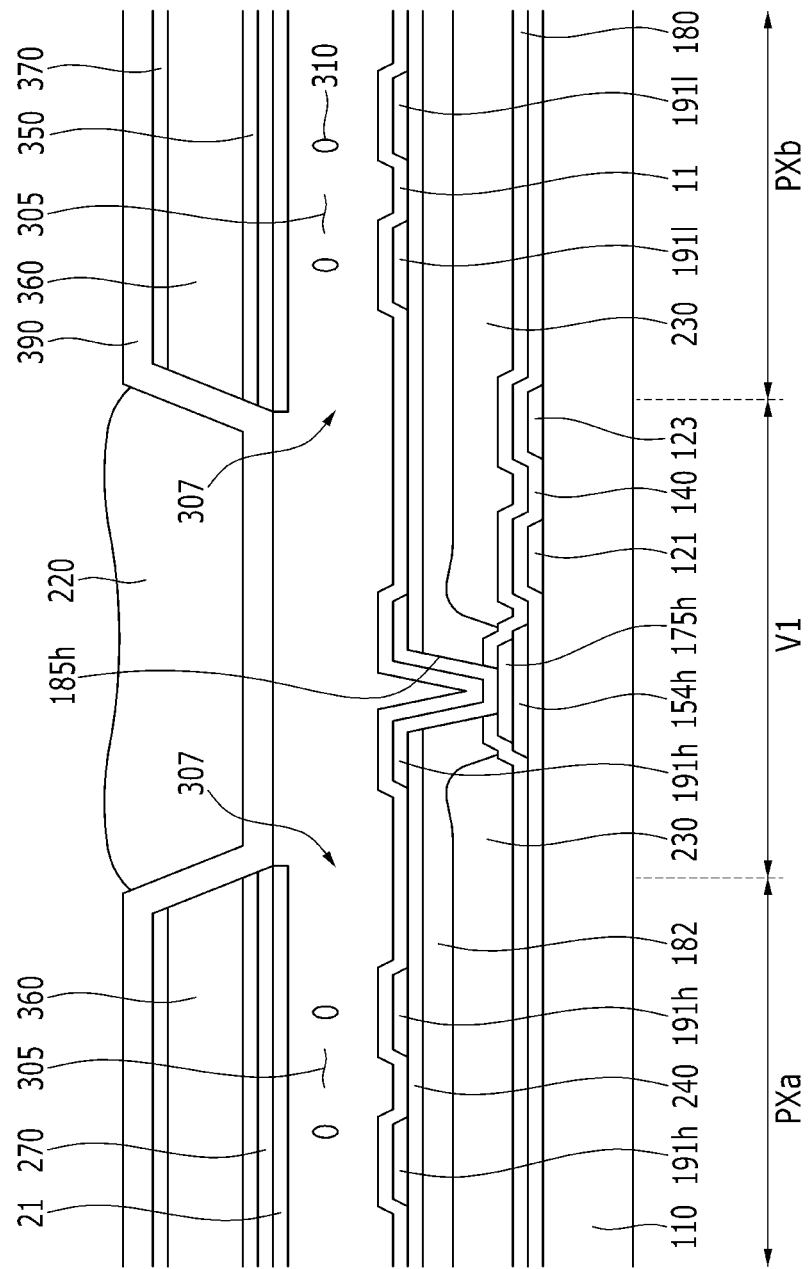
FIG. 17 is a cross-sectional view illustrating a part of a display device according to an embodiment.

Because the display device illustrated in FIG. 17, has a lot of the same elements as those of the display device illustrated in FIGS. 1 to 4, a description thereof will be omitted. The embodiment of FIG. 17 is different in that the color filter is formed under the encapsulation layer, and this difference will be described hereinafter in more detail.

FIG. 17 is a cross-sectional view illustrating a part of the display device according to another embodiment.

In the display device, first to third thin film transistors Qh, Ql, and Qc are formed on a substrate 110.

A passivation layer 180 is formed on the first to third thin film transistors Qh, Ql, and Qc, and color filters 230 are formed on the passivation layer 180. The color filters 230 are formed in a first sub-pixel area PXa and a second sub-pixel area PXb. In addition, the color filter 230 may also be formed in a first valley V1 positioned between the first sub-pixel area PXa and the second sub-pixel area PXb. Although FIG. 17 illustrates the color filter 230 formed at an edge region of the first valley V1, the present invention is not limited thereto, and the color filter 230 may be formed in the entire region of the first valley V1.

A planarization layer 182 is formed on the color filter 230 so as to mitigate level differences that occur by forming the color filter 230. A first insulating layer 240 is formed on the planarization layer 182.

A first contact hole 185h which exposes at least a part of the first thin film transistor Qh and a second contact hole 185l which exposes at least a part of the second thin film transistor Ql are formed in the first insulating layer 240, the planarization layer 182, and the passivation layer 180. The first and second contact holes 185h and 185l may also be formed in the color filter 230.

A first sub-pixel electrode 191h which is connected to the first thin film transistor Qh through the first contact hole 185h and a second sub-pixel electrode 191l which is connected to the second thin film transistor Ql through the second contact hole 185l are formed on the first insulating layer 240.

Roof layers 360 are formed on the first and second sub-pixel electrodes 191h and 191l so as to be spaced apart from the first and second sub-pixel electrodes 191h and 191l while interposing a plurality of microcavities 305 therebetween. Injection holes 307 are formed in the roof layer 360 so as to expose a part of the microcavity 305, and a liquid crystal layer formed of liquid crystal molecules 310 is formed in the microcavity 305.

An encapsulation layer 390 is formed on the roof layers 360 so as to cover the injection holes 307, and seals the microcavity 305. The encapsulation layer 390 is formed on the color filter 230.

An organic layer such as a light blocking member 220 is formed on the encapsulation layer 390. The color filter 230 formed under the encapsulation layer 390 and the light blocking member 220 formed on the encapsulation layer 390 may be formed to be overlapped with each other. For example, as illustrated, the color filter 230 and the light blocking member 220 may be overlapped with each other at a boundary between the first valley V1 and the first sub-pixel area PXa, and at a boundary between the first valley V1 and the second sub-pixel area PXb.

The light blocking member 220 is formed at boundaries of a plurality of pixel areas PX and on the thin film transistor, and formed in the first valley V1 positioned between the first sub-pixel area PXa and the second sub-pixel area PXb so as to serve to prevent light leakage.

Next, a method of manufacturing the display device according to another embodiment will be described with reference to FIGS. 18 to 22. Moreover, the method will be described with reference to FIGS. 1 and 2.

FIGS. 18 to 22 are process cross-sectional views illustrating a method of manufacturing the display device according to another embodiment.

Figure 18:
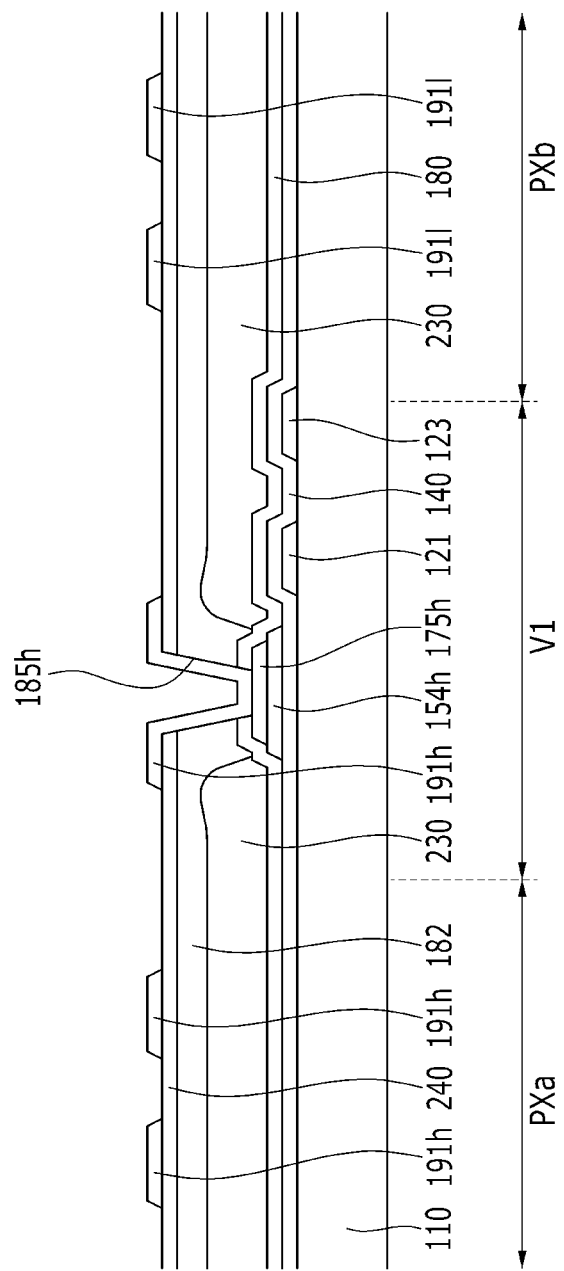
FIGS. 18 to 22 are process cross-sectional views illustrating a method of manufacturing the display device according to an embodiment.

First, as illustrated in FIG. 18, the first to third thin film transistors Qh, Ql, and Qc are formed on the substrate 110.

Next, the passivation layer 180 is formed on the first to third thin film transistors Qh, Ql, and Qc, and the color filter 230 is formed on the passivation layer 180.

The color filters 230 may be formed in the first sub-pixel area PXa and the second sub-pixel area PXb. In addition, the color filter 230 may also be formed in the first valley V1 positioned between the first sub-pixel area PXa and the second sub-pixel area PXb. Although FIG. 18 illustrates the color filter 230 formed at an edge region of the first valley V1, in some embodiments, the color filter 230 may be formed in the entire region of the first valley V1.

In a case in which the color filters 230 having three colors are formed, the color filter 230 having a first color is formed first, and then the color filter 230 having a second color may be formed by shifting a mask. Next, after the color filter 230 having the second color is formed, the color filter 230 having a third color may be formed by shifting the mask again.

Next, the planarization layer 182 is formed on the color filter 230, and the first insulating layer 240 may be formed on the planarization layer 182.

Next, the first insulating layer 240, the planarization layer 182, and the passivation layer 180 are patterned to form the first contact hole 185h which exposes at least a part of the first thin film transistor Qh and the second contact hole 185l which exposes at least a part of the second thin film transistor Ql. The first and second contact holes 185h and 185l may also be formed in the color filter 230.

Next, the first and second sub-pixel electrodes 191h and 191l, which are connected to the first and second thin film transistors Qh and Ql through the first and second contact holes 185h and 185l, respectively, are formed on the first insulating layer 240.

Figure 19:
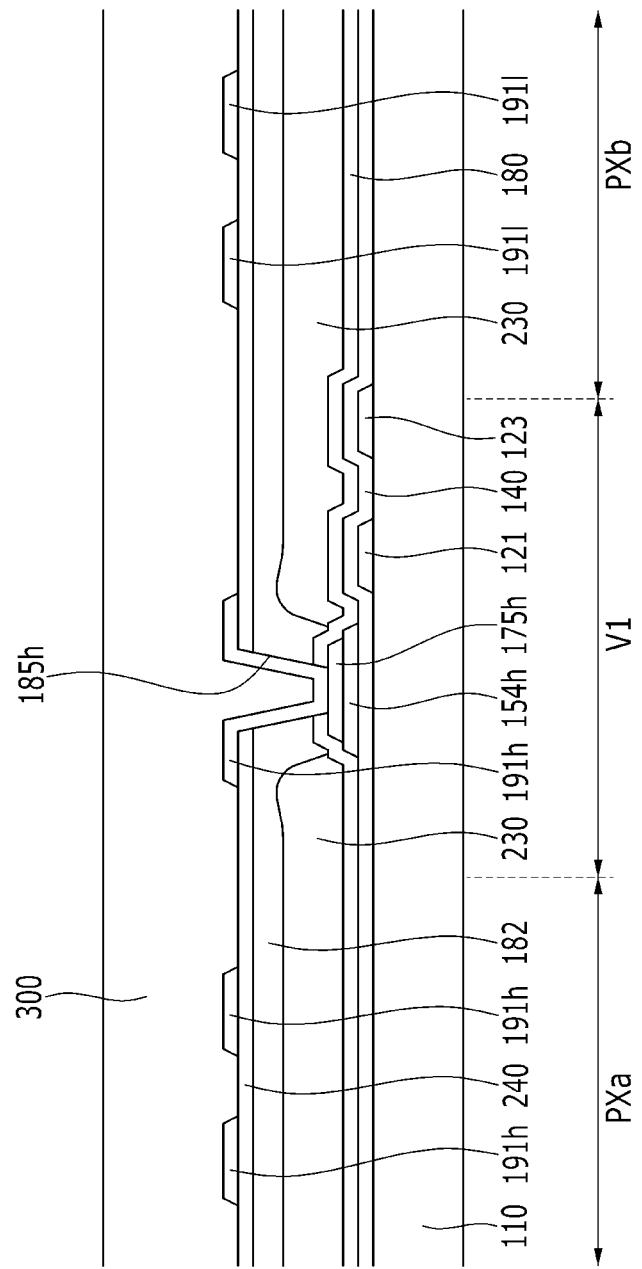

As illustrated in FIG. 19, a sacrificial layer 300 is formed on the first and second sub-pixel electrodes 191h and 191l.

Figure 20:
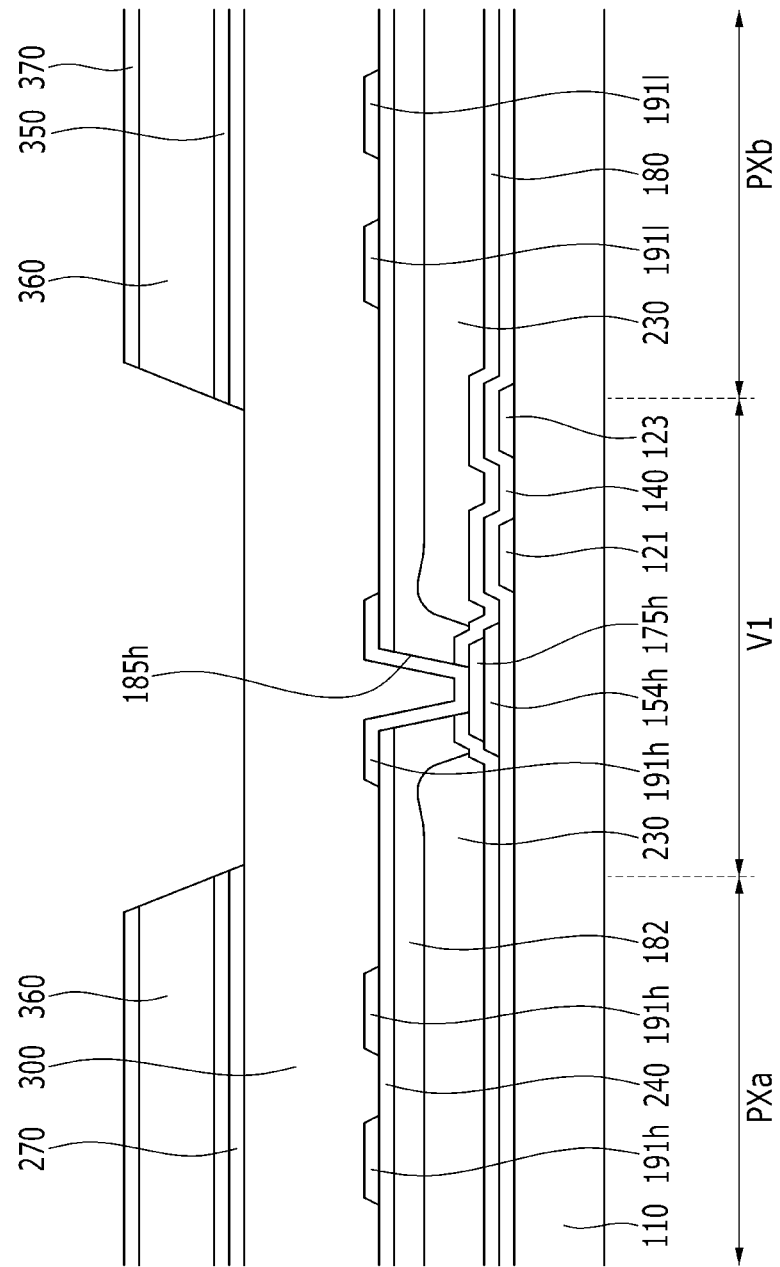

As illustrated in FIG. 20, a common electrode 270, a second insulating layer 350, the roof layer 360, and a third insulating layer 370 are formed on the sacrificial layer 300, and the common electrode 270, the second insulating layer 350, the roof layer 360, and the third insulating layer 370 are simultaneously or individually patterned so as to remove the common electrode 270, the second insulating layer 350, the roof layer 360, and the third insulating layer 370, which are positioned in the first valley V1.

Figure 21:
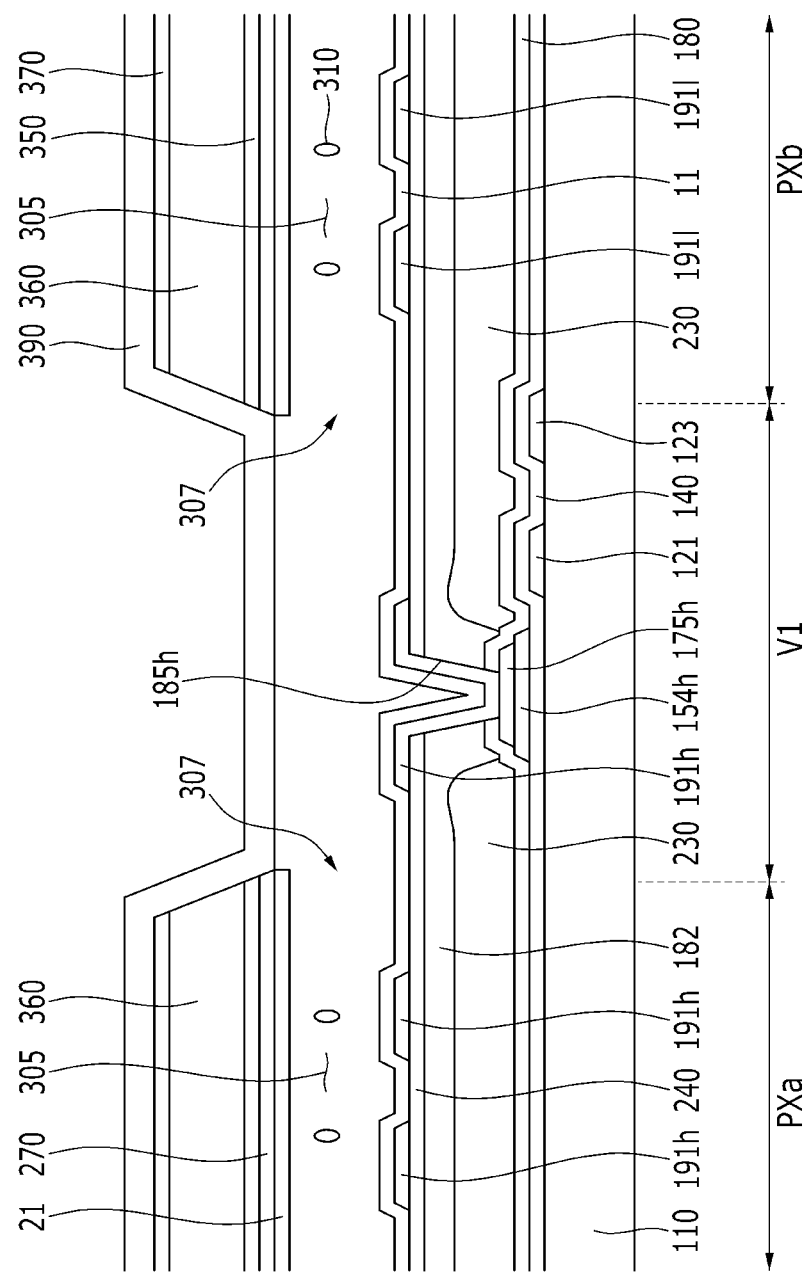

As illustrated in FIG. 21, the sacrificial layer 300 is removed to form the microcavity 305, and an alignment agent is injected into the microcavity 305 through the injection holes 307 so as to form first and second alignment layers 11 and 21.

Next, a liquid crystal material is injected into the microcavity 305 through the injection holes 307 so as to form the liquid crystal layer formed of liquid crystal molecules 310.

Next, the encapsulation layer 390 is formed on the third insulating layer 370 so as to seal the microcavity 305. At this time, the encapsulation layer 390 is formed on the color filter 230.

Figure 22:
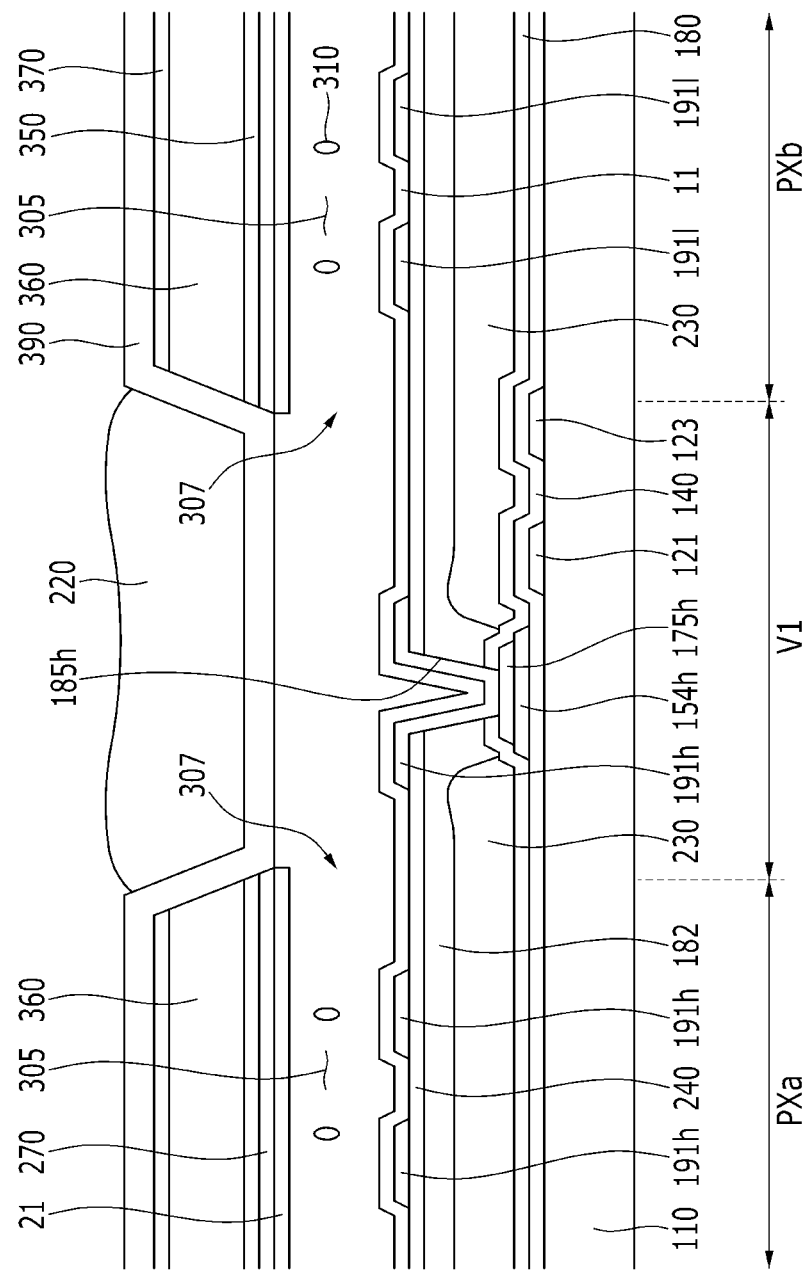

As illustrated in FIG. 22, the organic layer formed as the light blocking member 220 is formed on the encapsulation layer 390. The light blocking member 220 is formed at boundaries of the plurality of pixel areas PX and on the thin film transistor, and may be formed in the first valley V1 positioned between the first sub-pixel area PXa and the second sub-pixel area PXb.

The light blocking member 220 may be formed to be overlapped with the color filter 230. For example, as illustrated, the color filter 230 and the light blocking member 220 may be formed to be overlapped with each other at a boundary between the first valley V1 and the first sub-pixel area PXa, and at a boundary between the first valley V1 and the second sub-pixel area PXb.

While this invention has been described in connection with certain embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
a substrate including a plurality of pixel areas;
a thin film transistor disposed on the substrate;
a pixel electrode connected to the thin film transistor and disposed in the plurality of pixel areas;
a roof layer disposed on the pixel electrode;
a plurality of microcavities interposed between the pixel electrode and the roof layer;
an injection hole disposed in the roof layer, the injection hole configured to expose at least a portion of the plurality of microcavities;
a liquid crystal layer filled in at least one of the plurality of microcavities;
an encapsulation layer disposed on the roof layer, the encapsulation layer configured to cover the injection hole and to seal the plurality of microcavities; and
an organic layer disposed on the encapsulation layer, the organic layer comprising a light blocking member and a color filter,
wherein the encapsulation layer is disposed between the roof layer and the organic layer in a vertical direction, and
wherein the encapsulation layer prevents contact between the liquid crystal layer and the organic layer.

2. The display device of claim 1, further comprising:
a first valley positioned between adjacent microcavities among the plurality of microcavities,
wherein light blocking member is disposed in the first valley.

3. The display device of claim 2, wherein:
the light blocking member is further disposed at a boundary of a pixel area from the plurality of pixel areas.

4. The display device of claim 2, wherein:
the color filter is disposed in at least one of the plurality of pixel areas.

5. The display device of claim 4, wherein:
the light blocking member and the color filter are disposed to be overlapped with each other in a partial region.

6. The display device of claim 2,
wherein the color filter is disposed between the thin film transistor and the pixel electrode.

7. The display device of claim 1, wherein:
the color filter is disposed in at least one of the plurality of pixel areas.

8. The display device of claim 7, wherein:
the color filter is further disposed at a boundary of at least one of the plurality of pixel areas.

9. The display device of claim 8, wherein the light blocking member is disposed between the pixel electrode and the encapsulation layer,
wherein the light blocking member is disposed at a boundary of at least one of the plurality of pixel areas.

10. The display device of claim 1, further comprising:
a planarization layer disposed between the thin film transistor and the pixel electrode.

11. A method of manufacturing a display device, comprising:
forming a thin film transistor on a substrate, the substrate including a plurality of pixel areas;
forming a pixel electrode connected to the thin film transistor;
forming a sacrificial layer on the pixel electrode;
forming a roof layer on the sacrificial layer;
forming, by patterning the roof layer, an injection hole configured to expose at least a part of the sacrificial layer;
forming, by removing the sacrificial layer, a plurality of microcavities between the pixel electrode and the common electrode;
forming a liquid crystal layer by injecting a liquid crystal material into the plurality of microcavities;
sealing the plurality of microcavities by forming an encapsulation layer on the roof layer; and
forming an organic layer on the encapsulation layer, the organic layer comprising a light blocking member and a color filter,
wherein the encapsulation layer is formed between the roof layer and the organic layer in a vertical direction, and
wherein the encapsulation layer prevents contact between the liquid crystal layer and the organic layer.

12. The method of claim 11, wherein:
a first valley is positioned between adjacent microcavities from the plurality of microcavities, and
wherein the light blocking member is formed in the first valley.

13. The method of claim 12, wherein:
the light blocking member is further formed at a boundary of at least one of the plurality of pixel areas.

14. The method of claim 12, wherein:
the color filter is formed in at least one of the plurality of pixel areas.

15. The method of claim 14, wherein:
the light blocking member and the color filter are formed to be overlapped with each other in a partial region.

16. The method of claim 12, further comprising:
forming the color filter on the thin film transistor,
wherein the pixel electrode is formed on the color filter.

17. The method of claim 11, wherein:
the color filter is formed in at least one of the plurality of pixel areas.

18. The method of claim 17, wherein:
the color filter is further formed at a boundary of at least one of the plurality of pixel areas.

19. The method of claim 18, further comprising:
forming the light blocking member on the pixel electrode, wherein the encapsulation layer is formed on the light blocking member.

20. The method of claim 11, further comprising:
forming a planarization layer on the thin film transistor, wherein the pixel electrode is formed on the planarization layer.

* * * * *